(12) United States Patent
Numata et al.

(10) Patent No.: US 7,929,342 B2
(45) Date of Patent: Apr. 19, 2011

(54) MAGNETIC MEMORY CELL, MAGNETIC RANDOM ACCESS MEMORY, AND DATA READ/WRITE METHOD FOR MAGNETIC RANDOM ACCESS MEMORY

(75) Inventors: Hideaki Numata, Tokyo (JP); Norikazu Ohshima, Tokyo (JP); Tetsuhiro Suzuki, Tokyo (JP); Tadahiko Sugibayashi, Tokyo (JP); Nobuyuki Ishiwata, Tokyo (JP); Shunsuke Fukami, Tokyo (JP)

(73) Assignee: NEC Corporation, Tokyo (JP)

( * ) Notice: Subject to any disclaimer, the term of this patent is extended or adjusted under 35 U.S.C. 154(b) by 686 days.

(21) Appl. No.: 11/996,711

(22) PCT Filed: Aug. 4, 2006

(86) PCT No.: PCT/JP2006/315528
§ 371 (c)(1),
(2), (4) Date: Jan. 24, 2008

(87) PCT Pub. No.: WO2007/020823
PCT Pub. Date: Feb. 22, 2007

(65) Prior Publication Data
US 2010/0142264 A1    Jun. 10, 2010

(30) Foreign Application Priority Data

Aug. 15, 2005 (JP) ................................. 2005-235187
Mar. 28, 2006 (JP) ................................. 2006-088068

(51) Int. Cl.
*G11C 11/14* (2006.01)
(52) U.S. Cl. ................... 365/171; 365/158; 365/189.14; 257/421
(58) Field of Classification Search ............... 365/171, 365/158, 189.14; 257/421
See application file for complete search history.

(56) References Cited

U.S. PATENT DOCUMENTS 5,640,343 A    6/1997    Gallagher et al.
(Continued)

FOREIGN PATENT DOCUMENTS

JP    6-84347 A    3/1994
(Continued)

OTHER PUBLICATIONS

K. Yagami and Y. Suzuki, Research Trends in Spin Transfer Magnetization Switching.
(Continued)

*Primary Examiner* — Son Dinh
*Assistant Examiner* — Toan Le
(74) *Attorney, Agent, or Firm* — Sughrue Mion, PLLC

(57) ABSTRACT

The present invention provides a new data writing method for an MRAM which can suppress deterioration of a tunnel barrier layer.

A magnetic memory cell 1 has a magnetic recording layer 10 and a pinned layer 30 connected to the magnetic recording layer 10 through a non-magnetic layer 20. The magnetic recording layer 10 includes a magnetization switching region 13, a first magnetization fixed region 11 and a second magnetization fixed region 12. The magnetization switching region 13 has reversible magnetization and faces the pinned layer 30. The first magnetization fixed region 11 is connected to a first boundary B1 of the magnetization switching region 13 and its magnetization direction is fixed to a first direction. The second magnetization fixed region 12 is connected to a second boundary B2 of the magnetization switching region 13 and its magnetization direction is fixed to a second direction. Both of the first direction and the second direction are toward the magnetization switching region 13 or away from the magnetization switching region 13.

43 Claims, 32 Drawing Sheets

U.S. PATENT DOCUMENTS

| | | |
|---|---|---|
| 6,191,989 B1 | 2/2001 | Luk et al. |
| 6,545,906 B1 | 4/2003 | Savtchenko et al. |
| 6,795,340 B2 | 9/2004 | Sakimura et al. |
| 6,834,005 B1 | 12/2004 | Parkin |
| 6,888,742 B1 | 5/2005 | Nguyen et al. |
| 6,956,765 B2 | 10/2005 | Saito et al. |
| 7,064,974 B2* | 6/2006 | Suzuki et al. ............... 365/158 |
| 7,184,301 B2* | 2/2007 | Sugibayashi et al. ......... 365/158 |
| 7,254,057 B2 | 8/2007 | Hidaka |
| 7,459,737 B2 | 12/2008 | Ohmori et al. |
| 7,768,824 B2 | 8/2010 | Yoshikawa et al. |
| 2003/0123199 A1 | 7/2003 | Honda et al. |
| 2004/0100835 A1 | 5/2004 | Sugibayashi et al. |
| 2005/0002229 A1* | 1/2005 | Matsutera et al. ............ 365/171 |
| 2005/0162970 A1 | 7/2005 | Motoyoshi et al. |

FOREIGN PATENT DOCUMENTS

| | | |
|---|---|---|
| JP | 11-195824 A | 7/1999 |
| JP | 2000-12790 A | 1/2000 |
| JP | 2000-82791 A | 3/2000 |
| JP | 2002-56665 A | 2/2002 |
| JP | 2002-100181 A | 4/2002 |
| JP | 2002-140889 A | 5/2002 |
| JP | 2002-197852 A | 7/2002 |
| JP | 2002190579 | 7/2002 |
| JP | 2002-230965 A | 8/2002 |
| JP | 2002252394 | 9/2002 |
| JP | 2003-281880 A | 10/2003 |
| JP | 2003-346474 A | 12/2003 |
| JP | 2004-153070 A | 5/2004 |
| JP | 2004172614 | 6/2004 |
| JP | 2004179183 | 6/2004 |
| JP | 2004-207707 A | 7/2004 |
| JP | 2004-348934 A | 12/2004 |
| JP | 2005-19561 A | 1/2005 |
| JP | 2005-505889 A | 2/2005 |
| JP | 2005-93488 A | 4/2005 |
| JP | 2005109470 | 4/2005 |
| JP | 2005-150303 A | 6/2005 |
| JP | 2005-191032 A | 7/2005 |
| JP | 2005191032 | 7/2005 |
| JP | 2005223086 | 8/2005 |
| JP | 2005277147 | 10/2005 |
| JP | 2005294340 | 10/2005 |
| JP | 20065308 | 1/2006 |
| JP | 2006-73930 A | 3/2006 |
| JP | 2006-93432 A | 4/2006 |
| JP | 2006-93578 A | 4/2006 |
| JP | 2006-128394 A | 5/2006 |
| JP | 2006-185961 A | 7/2006 |
| JP | 2006-270069 A | 10/2006 |
| JP | 2007-258460 A | 10/2007 |
| JP | 2007-317895 A | 12/2007 |
| WO | WO 2006/090656 A1 | 8/2006 |

OTHER PUBLICATIONS

A. Yamaguchi et al., Real-Space Observation of Current-Driven Domain Wall Motion in Submicron Magnetic Wires, The American Physical Society, 2004.

Hosomi, et al., "A Novel Nonvolatile Memory with Spin Torque Transfer Magnetization Switching: Spin-RAM", International Electron Devices Meeting, Technical Digest, 2005, pp. 473-476, IEEE.

Scheuerlein, et al., "A 10ns Read and Write Non-Volatile Memory Array Using a Magnetic Tunnel Junction and FET Switch in each Cell", 2000 IEEE International Solid-State Circuits Conference, 2000, p. 128, IEEE.

Duram, et al., "Nonvolatile RAM based on Magnetic Tunnel Junction Elements", 2000 IEEE International Solid-State Circuits Conference, 2000, p. 130, IEEE.

U.S. Appl. No. 12/518,532, filed Jun. 10, 2009, inventor: S. Fukami (Notice of Allowance Jan. 7, 2011).

U.S. Appl. No. 12/527,993 filed Aug. 20, 2009, inventor: N. Sakimura (Notice of Allowance Jan. 7, 2011).

U.S. Appl. No. 12/526,994 filed Oct. 6, 2009, inventor: S. Fukami (Office Action Jan. 27, 2011).

* cited by examiner

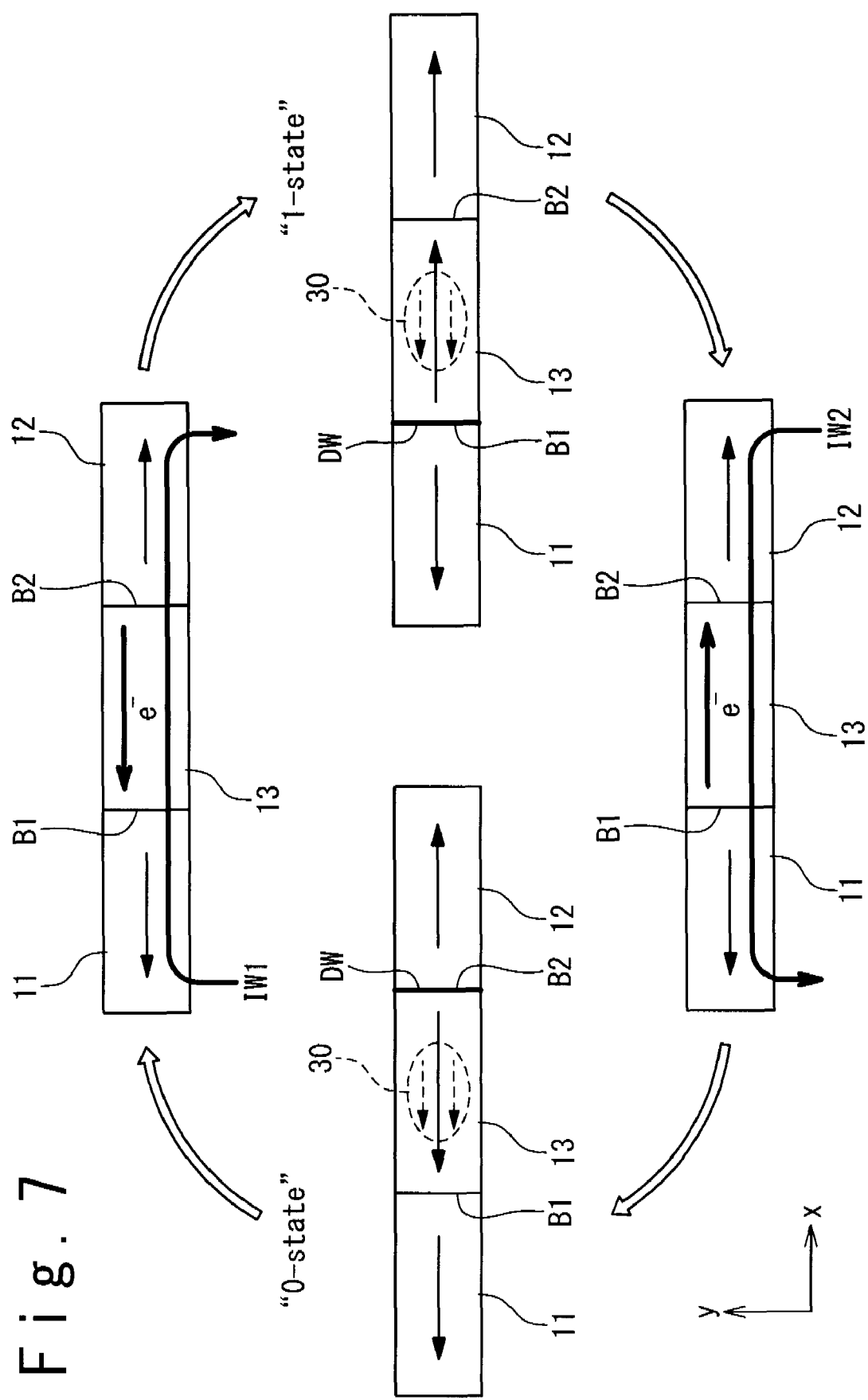

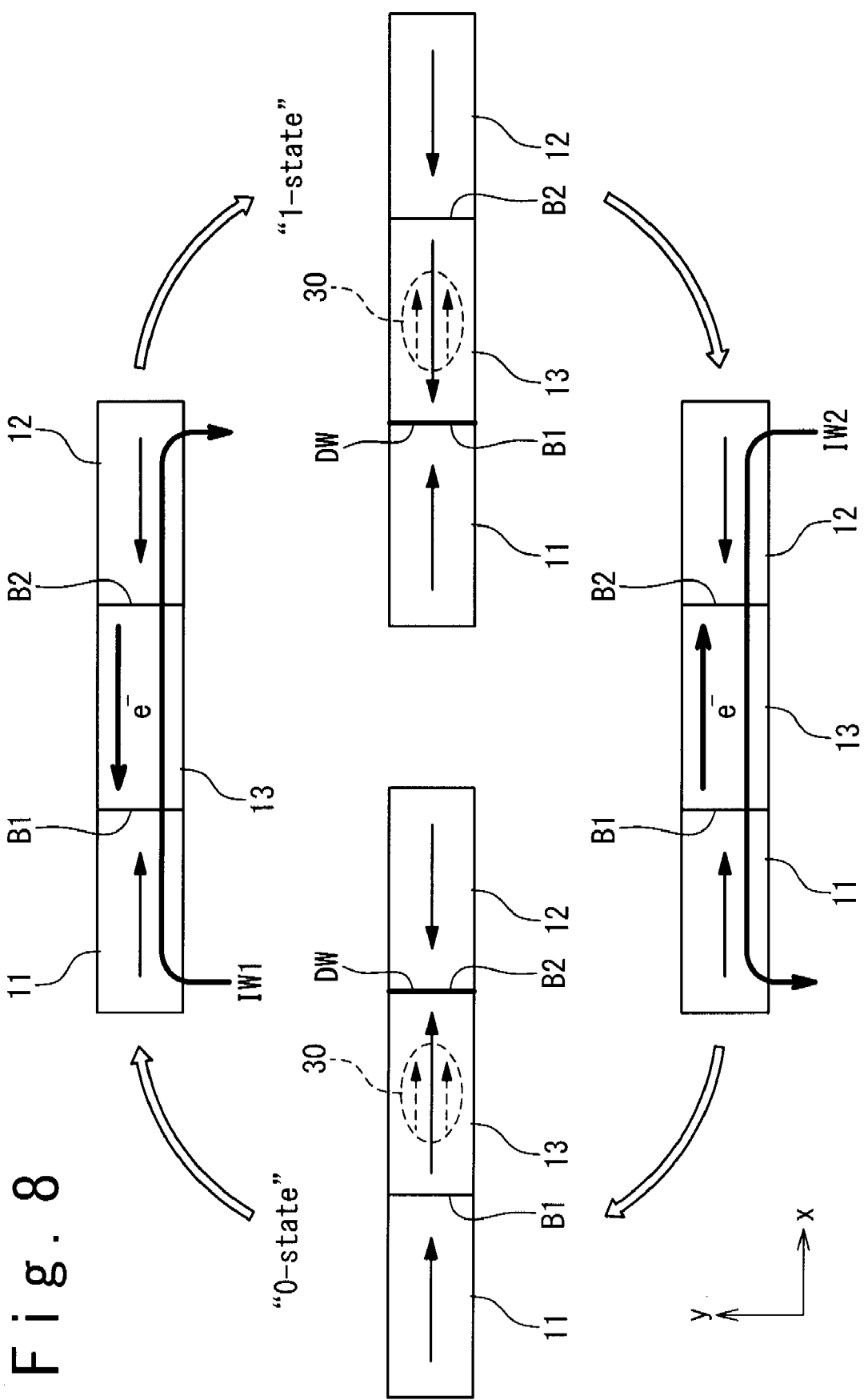

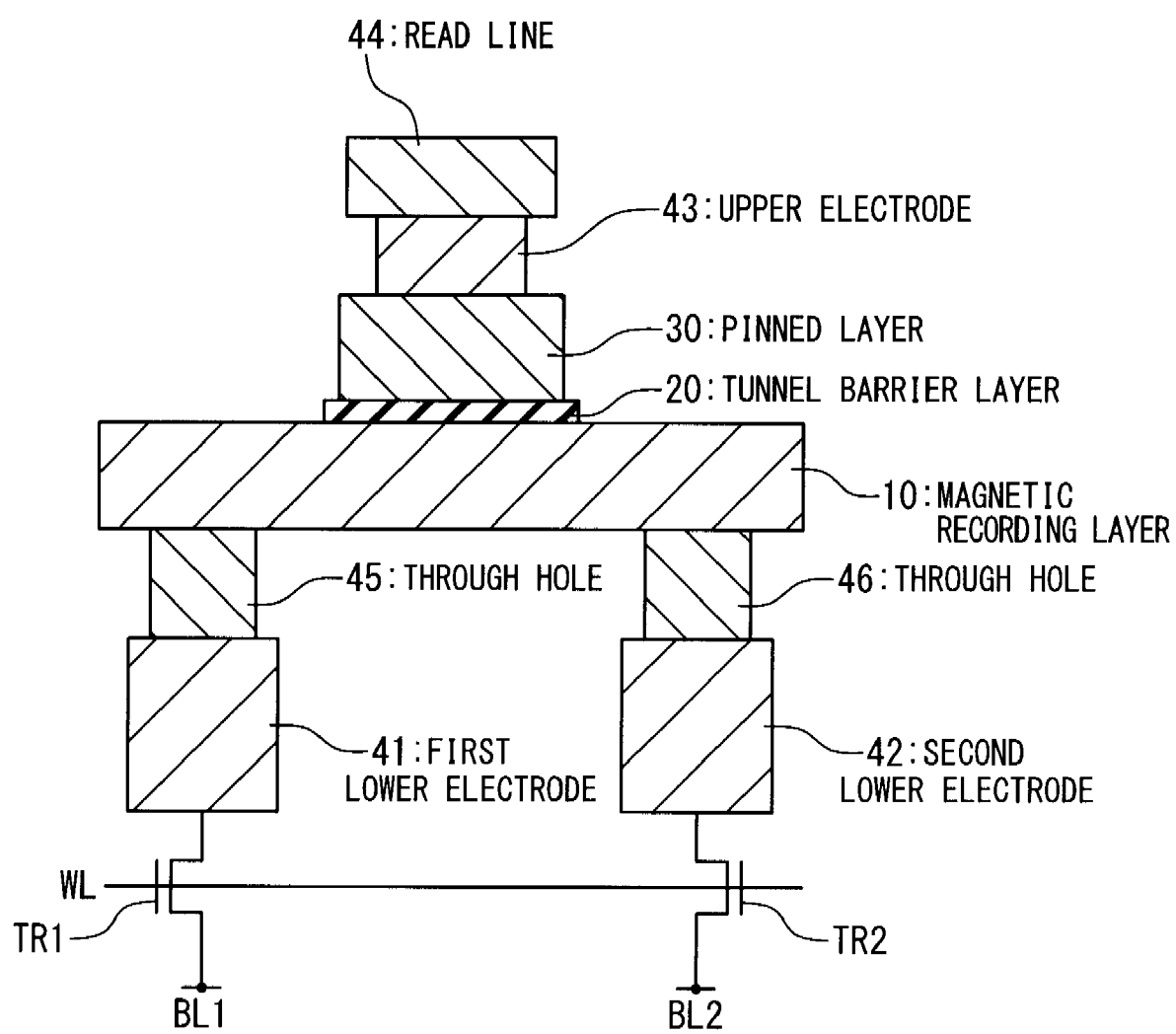

Fig. 11

| "1" WRITING | · WORD LINE WL=H<br>· BIT LINE BL1=H<br>· BIT LINE BL2=L |
|---|---|
| "0" WRITING | · WORD LINE WL=H<br>· BIT LINE BL1=L<br>· BIT LINE BL2=H |
| READING | · WORD LINE WL=H<br>$\begin{cases} \cdot \text{BIT LINE BL1=H} \\ \cdot \text{BIT LINE BL2=open} \end{cases}$<br>OR<br>$\begin{cases} \cdot \text{BIT LINE BL1=open} \\ \cdot \text{BIT LINE BL2=H} \end{cases}$ |

MAGNETIC MEMORY CELL, MAGNETIC RANDOM ACCESS MEMORY, AND DATA READ/WRITE METHOD FOR MAGNETIC RANDOM ACCESS MEMORY

TECHNICAL FIELD

The present invention relates to a magnetic random access memory in which magnetic memory cells are integrated, and a data read/write method for the magnetic random access memory.

BACKGROUND ART

An MRAM (Magnetic Random Access Memory) is a promising nonvolatile memory from a viewpoint of high integration and high-speed operation. In the MRAM, a magnetoresistance element that exhibits a "magnetoresistance effect" such as TMR (Tunnel MagnetoResistance) effect is utilized. In the magnetoresistance element, for example, an MTJ (Magnetic Tunnel Junction) in which a tunnel barrier layer is sandwiched by two ferromagnetic layers is formed. The two ferromagnetic layers include a pinned layer whose magnetization direction is fixed and a free layer whose magnetization direction is reversible.

It is known that a resistance value (R+ΔR) of the MTJ when the magnetization directions of the pinned layer and the free layer are "anti-parallel" to each other becomes larger than a resistance value (R) when the magnetization directions are "parallel" to each other due to the magnetoresistance effect. The MRAM uses the magnetoresistance element having the MTJ as a memory cell and nonvolatilely stores data by utilizing the change in the resistance value. Data writing to the memory cell is performed by switching the magnetization direction of the free layer.

Conventionally known methods of data writing to the MRAM include an "asteroid method" disclosed for example in U.S. Pat. No. 5,640,343 and a "toggle method" disclosed for example in U.S. Pat. No. 6,545,906 and National Publication of the Translated Version of PCT Application JP-2005-505889. According to these write methods, a magnetic switching field necessary for switching the magnetization of the free layer increases in substantially inverse proportion to the size of the memory cell. That is to say, a write current tends to increase with the miniaturization of the memory cell.

As a write method capable of suppressing the increase in the write current with the miniaturization, there is proposed a "spin transfer method" as disclosed in Japanese Laid-Open Patent Application JP-2005-093488 and "Yagami and Suzuki, Research Trends in Spin Transfer Magnetization Switching, Journal of The Magnetics Society of Japan, Vol. 28, No. 9, 2004. According to the spin transfer method, a spin-polarized current is injected to a ferromagnetic conductor, and direct interaction between spin of conduction electrons of the current and magnetic moment of the conductor causes the magnetization to be switched (hereinafter referred to as "Spin Transfer Magnetization Switching"). The spin transfer magnetization switching will be outlined below with reference to FIG. 1.

In FIG. 1, a magnetoresistance element is provided with a free layer 101, a pinned layer 103, and a tunnel barrier layer 102 that is a non-magnetic layer sandwiched between the free layer 101 and the pinned layer 103. Here, the pinned layer 103, whose magnetization direction is fixed, is so formed as to be thicker than the free layer 101 and serves as a spin filter, i.e. a mechanism for generating the spin-polarized current. A state in which the magnetization directions of the free layer 101 and the pinned layer 103 are parallel to each other is related to data "0", while a state in which they are anti-parallel to each other is related to data "1".

The spin transfer magnetization switching shown in FIG. 1 is achieved by a CPP (Current Perpendicular to Plane) method, where a write current is injected in a direction perpendicular to the film plane. More specifically, the current is flowed from the pinned layer 103 to the free layer 101 in a transition from data "0" to data "1". In this case, electrons having the same spin state as that of the pinned layer 103 being the spin filter move from the free layer 101 to the pinned layer 103. As a result of the spin transfer (transfer of spin angular momentum) effect, the magnetization of the free layer 101 is switched. On the other hand, the current is flowed from the free layer 101 to the pinned layer 103 in a transition from data "1" to data "0". In this case, electrons having the same spin state as that of the pinned layer 103 being the spin filter move from the pinned layer 103 to the free layer 101. As a result of the spin transfer effect, the magnetization of the free layer 101 is switched.

In this manner, the data writing is performed by transferring the spin electrons in the spin transfer magnetization switching. It is possible to set the magnetization direction of the free layer 101 depending on the direction of the spin-polarized current perpendicular to the film plane. Here, it is known that the threshold value of the writing (magnetization switching) depends on current density. Therefore, the write current necessary for the magnetization switching decreases with the reduction of the size of the memory cell. Since the write current is decreased with the miniaturization of the memory cell, the spin transfer magnetization switching is important in realizing a large-capacity MRAM.

As a related technique, U.S. Pat. No. 6,834,005 discloses a magnetic shift resister that utilizes the spin transfer. The magnetic shift resister stores data by utilizing a domain wall in a magnetic body. In the magnetic body having a large number of separated regions (magnetic domains), a current is so flowed as to pass through the domain wall and the current causes the domain wall to move. The magnetization direction in each of the regions is treated as a record data. For example, such a magnetic shift resister is used for recording large quantities of serial data. It should be noted that the domain wall motion in a magnetic body is reported also in Yamaguchi et al., PRL, Vol. 92, pp. 077205-1, 2004.

Japanese Laid-Open Patent Application JP-2005-191032 discloses a magnetic storage device provided with a magnetization fixed layer whose magnetization is fixed, a tunnel insulating layer laminated on the magnetization fixed layer, and a magnetization free layer laminated on the tunnel insulating layer. The magnetization free layer has a connector section overlapping with the tunnel insulating layer and the magnetization fixed layer, constricted sections adjacent to both ends of the connector section, and a pair of magnetization fixed sections respectively formed adjacent to the constricted sections. The magnetization fixed sections are respectively provided with fixed magnetizations whose directions are opposite to each other. The magnetic storage device is further provided with a pair of magnetic information writing terminals which is electrically connected to the pair of magnetization fixed sections. By using the pair of magnetic information writing terminals, a current penetrating through the connector section, the pair of constricted sections and the pair of magnetization fixed sections in the magnetization free layer is flowed.

DISCLOSURE OF INVENTION

An object of the present invention is to provide a new data writing method for an MRAM.

Another object of the present invention is to provide an MRAM and a data writing method which can suppress deterioration of a tunnel barrier layer in an MTJ.

Still another object of the present invention is to provide an MRAM and a data writing method which can reduce a write current with reduction of a size of a memory cell.

Still another object of the present invention is to provide an MRAM and a data writing method which can increase a write speed with reduction of a size of a memory cell.

In a first aspect of the present invention, a magnetic memory cell is provided with a magnetic recording layer that is a ferromagnetic layer and a pinned layer connected to the magnetic recording layer through a non-magnetic layer. The magnetic recording layer includes a magnetization switching region, a first magnetization fixed region and a second magnetization fixed region. The magnetization switching region has reversible magnetization and is so provided as to face the pinned layer. The first magnetization fixed region is connected to a first boundary of the magnetization switching region and its magnetization direction is fixed to a first direction. The second magnetization fixed region is connected to a second boundary of the magnetization switching region and its magnetization direction is fixed to a second direction. Both of the first direction and the second direction are toward the magnetization switching region or away from the magnetization switching region. For example, the first direction is toward the first boundary, and the second direction is toward the second boundary. Alternatively, the first direction is away from the first boundary, and the second direction is away from the second boundary.

The magnetization direction of the magnetization switching region is toward any of the first boundary and the second boundary. A domain wall is formed at any of the first boundary and the second boundary in the magnetic recording layer. The domain wall in the magnetic recording layer moves between the first boundary and the second boundary of the magnetization switching region, due to a current flowing between the first magnetization fixed region and the second magnetization fixed region.

For example, the magnetization switching region, the first magnetization fixed region and the second magnetization fixed region are formed in the same plane. Preferably, the first magnetization fixed region and the second magnetization fixed region are formed parallel to each other, and the magnetization switching region is so formed as to connect between the first magnetization fixed region and the second magnetization fixed region.

For example, the magnetization switching region, the first magnetization fixed region and the second magnetization fixed region are linearly formed in the same plane. In this case, the first direction is opposite to the second direction. Preferably, a cross-sectional area of the magnetization switching region increases with distance from the first boundary and the second boundary, i.e. the magnetization switching region is formed to be most thick in its central portion. In a plane parallel to the first boundary and the second boundary, cross-sectional areas of the first magnetization fixed region and the second magnetization fixed region may be smaller than a cross-sectional area of the magnetization switching region.

Also, the first magnetization fixed region and the second magnetization fixed region may be formed such that the first direction and the second direction are the same. In this case, for example, the magnetization switching region, the first magnetization fixed region and the second magnetization fixed region are so formed as to have a U-shape. The magnetization switching region, the first magnetization fixed region and the second magnetization fixed region may be formed in the same plane. Alternatively, the magnetization switching region may be formed parallel to a first plane, while the first magnetization fixed region and the second magnetization fixed region may be formed perpendicular to the first plane. For example, the magnetization switching region is formed on a bottom surface of a trench section, while the first magnetization fixed region and the second magnetization fixed region are respectively formed on opposed side surfaces of the trench section.

The magnetic memory cell can be further provided with a first magnetic body applying a bias magnetic field of the first direction to the first magnetization fixed region and a second magnetic body applying a bias magnetic field of the second direction to the second magnetization fixed region. The first magnetic body and the second magnetic body may be so provided as to be in contact with the first magnetization fixed region and the second magnetization fixed region, respectively. In this case, the magnetization direction of the first magnetic body is the first direction and the magnetization direction of the second magnetic body is the second direction.

Also, the first magnetic body and the second magnetic body may be so provided as to be apart from the first magnetization fixed region and the second magnetization fixed region, respectively. For example, the first magnetic body and the second magnetic body are provided above or below the first magnetization fixed region and the second magnetization fixed region, respectively. In this case, the magnetization direction of the first magnetic body is opposite to the first direction and the magnetization direction of the second magnetic body is opposite to the second direction. Also, the first magnetic body and the second magnetic body may be provided in the same plane as that of the magnetic recording layer. Preferably, the first magnetic body and the second magnetic body are so provided as to sandwich the magnetic recording layer from both sides. In this case, the magnetization direction in an end section of the first magnetic body closest to the first magnetization fixed region is the first direction, and the magnetization direction in an end section of the second magnetic body closest to the second magnetization fixed region is the second direction.

The first magnetization fixed region and the second magnetization fixed region may have magnetic anisotropy of the same direction, and the magnetization switching region may have magnetic anisotropy of a direction different from that of the first magnetization fixed region and the second magnetization fixed region. A longitudinal direction of the first magnetization fixed region and a longitudinal direction of the second magnetization fixed region may be the same, and a longitudinal direction of the magnetization switching region may be different from the longitudinal direction of the first magnetization fixed region and the second magnetization fixed region. In this case, an external magnetic field whose direction is the same as the first direction and the second direction may be applied.

The data writing to the magnetic memory cell is performed in the following manner. In a first write operation, a first write current is flowed from the first magnetization fixed region through the magnetization switching region to the second magnetization fixed region. On the other hand, in a second write operation, a second write current is flowed from the second magnetization fixed region through the magnetization switching region to the first magnetization fixed region.

The domain wall is formed at the first boundary in the magnetic recording layer due to the first write operation, while the domain wall is formed at the second boundary in the magnetic recording layer due to the second write operation. In a case where the first direction is toward the first boundary and the second direction is toward the second boundary, the magnetization of the magnetization switching region turns toward the first boundary due to the first write operation, while the magnetization of the magnetization switching region turns toward the second boundary due to the second write operation. In a case where the first direction is away from the first boundary and the second direction is away from the second boundary, the magnetization of the magnetization switching region turns toward the second boundary due to the first write operation, while the magnetization of the magnetization switching region turns toward the first boundary due to the second write operation.

Also, an assist wiring which intersects with the magnetization switching region can be provided. Due to a current flowing through the assist wiring, an assist magnetic field is applied to the magnetization switching region. The assist wiring is designed such that the direction of the assist magnetic field assists the magnetization switching. Preferably, the assist wiring is connected to the first magnetization fixed region or the second magnetization fixed region. That is to say, the first write current flows through the assist wiring in the first write operation, while the second write current flows through the assist wiring in the second write operation. The assist wiring may include a first assist wiring formed below the magnetization switching region and a second assist wiring formed above the magnetization switching region.

In a read operation, a read current is flowed between the pinned layer and any of the first magnetization fixed region and the second magnetization fixed region through the magnetization switching region and the non-magnetic layer.

In the magnetic memory cell, the magnetic recording layer may further include another magnetization switching region having reversible magnetization and a third magnetization fixed region whose magnetization direction is fixed to a third direction. The other magnetization switching region is connected to the second magnetization fixed region at a third boundary and is connected to the third magnetization fixed region at a fourth boundary. Both of the second direction and the third direction are toward the other magnetization switching region or away from the other magnetization switching region. The first magnetization fixed region, the second magnetization fixed region and the third magnetization fixed region are formed parallel to each other. The magnetization switching region is so formed as to connect between the first magnetization fixed region and the second magnetization fixed region. The other magnetization switching region is so formed as to connect between the second magnetization fixed region and the third magnetization fixed region. For example, the magnetization switching region, the other magnetization switching region, the first magnetization fixed region, the second magnetization fixed region and the third magnetization fixed region are linearly formed. In this case, the first direction is opposite to the second direction, and the first direction and the third direction are the same. Alternatively, the first magnetization fixed region, the second magnetization fixed region and the third magnetization fixed region may be formed such that the first direction, the second direction and the third direction are the same. The other magnetization switching region is connected to another pinned layer through another non-magnetic layer.

In the present invention, it is preferable that the magnetization switching region is made of soft magnetic material. For example, the magnetization switching region includes at least one element selected from the group consisting of Co, Fe and Ni. Preferably, the soft magnetic material is microcrystalline in which grain diameter is not more than a film thickness, or amorphous. For example, composition of the magnetization switching region is represented by XX-YY-ZZ. In this case, the XX includes at least one element selected from the group consisting of Co, Fe and Ni. The YY includes at least one element selected from the group consisting of Al, Si, Mg, Ta, Nb, Zr, Hf, W, Mo, Ti and V. The ZZ includes at least one element selected from the group consisting of N, C, B and O. Also, composition of the magnetization switching region may be represented by XX-YY. The XX and the YY are as descried above. Moreover, composition of the magnetization switching region may be represented by XX-ZZ. The XX and the ZZ are as described above.

In a second aspect of the present invention, a magnetic memory cell is provided with a magneto resistance element, a first magnetization fixed section and a second magnetization fixed section. The magnetoresistance element has a free layer, a pinned layer, and a non-magnetic layer sandwiched between the free layer and the pinned layer. The first magnetization fixed section is connected to a first boundary of the free layer and its magnetization direction is fixed to a first direction. The second magnetization fixed section is connected to a second boundary of the free layer and its magnetization direction is fixed to a second direction. Both of the first direction and the second direction are toward the free layer or away from the free layer. In the free layer, a domain wall moves between the first boundary and the second boundary, due to a current flowing between the first magnetization fixed section and the second magnetization fixed section.

In a third aspect of the present invention, a magnetic random access memory is provided with the above-described magnetic memory cell, a word line connected to the magnetic memory cell; and a bit line connected to the magnetic memory cell.

For example, a first bit line is connected to the first magnetization fixed region through a first transistor. A second bit line is connected to the second magnetization fixed region through a second transistor. The word line is connected to gates of the first transistor and the second transistor. A write current supply circuit is connected to the first bit line and the second bit line. In the first write operation, the word line is selected, and the write current supply circuit supplies the first write current from the first bit line to the second bit line through the first transistor, the magnetic recording layer and the second transistor. On the other hand, in the second write operation, the word line is selected, and the write current supply circuit supplies the second write current from the second bit line to the first bit line through the second transistor, the magnetic recording layer and the first transistor.

Also, the second magnetization fixed region of the magnetic memory cell may be grounded. In this case, the bit line is connected to the first magnetization fixed region through a transistor, and the word line is connected to a gate of the transistor. A write current supply circuit is connected to the bit line. In the first write operation, the word line is selected, and the write current supply circuit supplies the first write current from the bit line to the magnetic memory cell through the transistor. On the other hand, in the second write operation, the word line is selected, and the write current supply circuit draws the second write current from the magnetic memory cell through the transistor and the bit line.

In a fourth aspect of the present invention, a data read and write method for a magnetic random access memory is provided. The magnetic random access memory is provided with the above-described magnetic memory cell. The data read and write method includes (A) a step of supplying a first write current from the first magnetization fixed region through the magnetization switching region to the second magnetization fixed region, when writing a first data, and (B) a step of supplying a second write current from the second magnetization fixed region through the magnetization switching region to the first magnetization fixed region, when writing a second data.

In a fifth aspect of the present invention, a data read and write method for a magnetic random access memory is provided. The magnetic random access memory is provided with the above-described magnetic memory cell. The data read and write method includes (A) a step of moving the domain wall in the magnetic recording layer to the first boundary by supplying a first write current from the first magnetization fixed region to the second magnetization fixed region, when writing a first data, and (B) a step of moving the domain wall to the second boundary by supplying a second write current from the second magnetization fixed region to the first magnetization fixed region, when writing a second data.

The data read and write method further includes (C) a step of flowing a read current between the pinned layer and any of the first magnetization fixed region and the second magnetization fixed region through the magnetization switching region and the non-magnetic layer, when reading the first data or the second data stored in the magnetic memory cell.

According to the present invention, a new data writing method for the MRAM is provided. More specifically, the write current is flowed not in a direction penetrating through the MTJ but planarly in the magnetic recording layer. Due to the spin transfer effect by the spin electrons, the magnetization of the magnetization switching region in the magnetic recording layer is switched to a direction depending on the write current direction. The domain wall in the magnetic recording layer moves back and forth like a "seesaw" between the first boundary and the second boundary, in accordance with the moving direction of the electrons of the write current. That is to say, the domain wall moves within the magnetization switching region (Domain Wall Motion).

Since the write current does not penetrate through the MTJ at the time of data writing, deterioration of the tunnel barrier layer in the MTJ is suppressed. Moreover, since the data writing is achieved by the spin transfer method, the write current is decreased with the reduction of the size of the memory cell. Furthermore, since a moving distance of the domain wall becomes shorter with the reduction of the size of the memory cell, the write speed is increased with the miniaturization of the memory cell.

BRIEF DESCRIPTION OF DRAWINGS

FIG. 7 is a plan view showing a principle of data writing for the magnetic memory cell shown in FIG. 6;

FIG. 8 is a plan view showing still another structural example of a magnetic memory cell according to the first exemplary embodiment and a principle of data writing for the magnetic memory cell;

FIG. 10B is a cross-sectional view schematically showing a circuit configuration of the magnetic memory cell according to the first exemplary embodiment;

FIG. 11 is a chart showing a summary of the data read/write method according to the first exemplary embodiment;

BEST MODE FOR CARRYING OUT THE INVENTION

A magnetic memory cell, a magnetic random access memory and a data read/write method for the magnetic random access memory according to the present invention will be described below with reference to the attached drawings.

Figure 1:
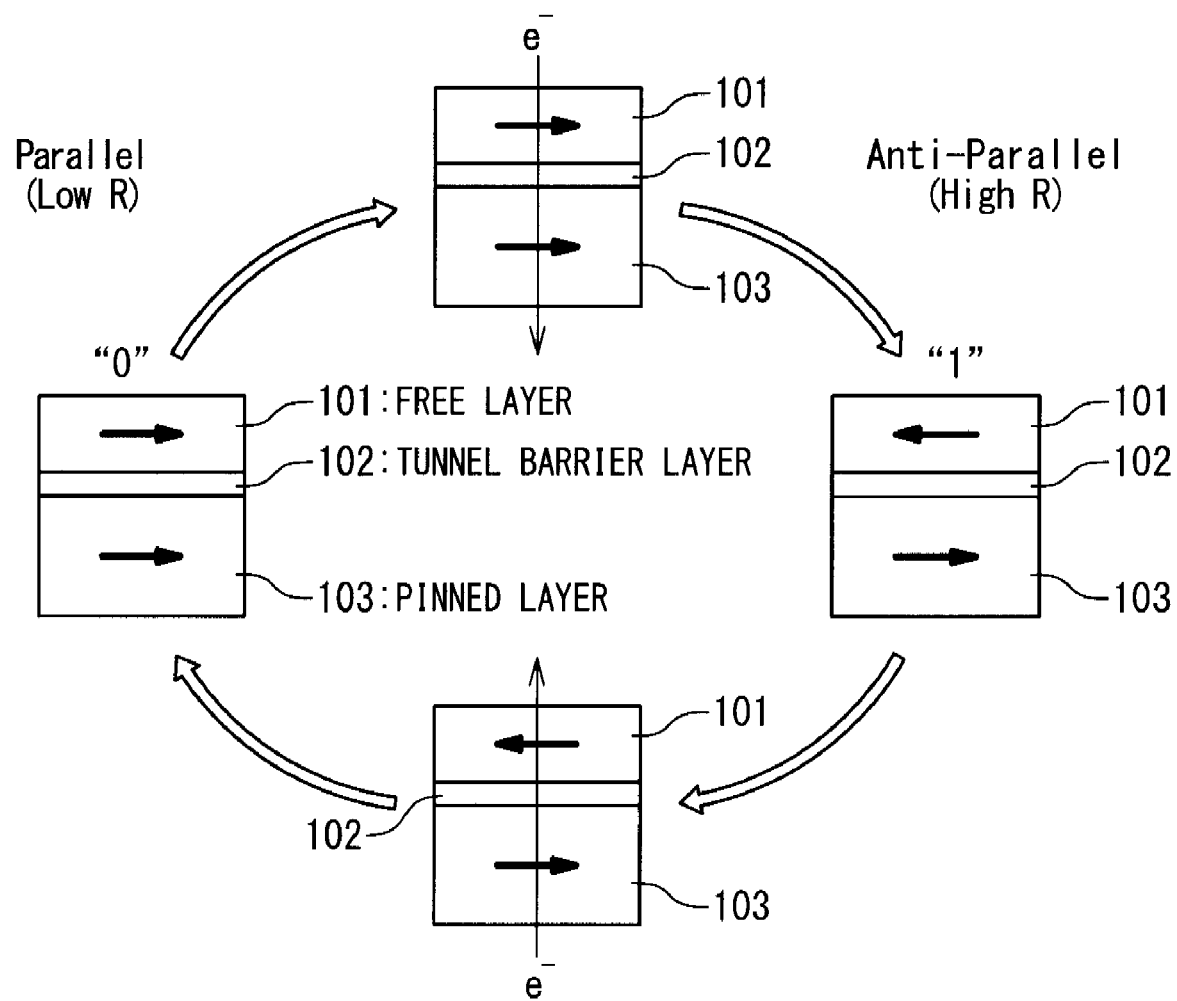
FIG. 1 is a diagram for explaining data writing according to a conventional spin transfer method.
Figure 2:
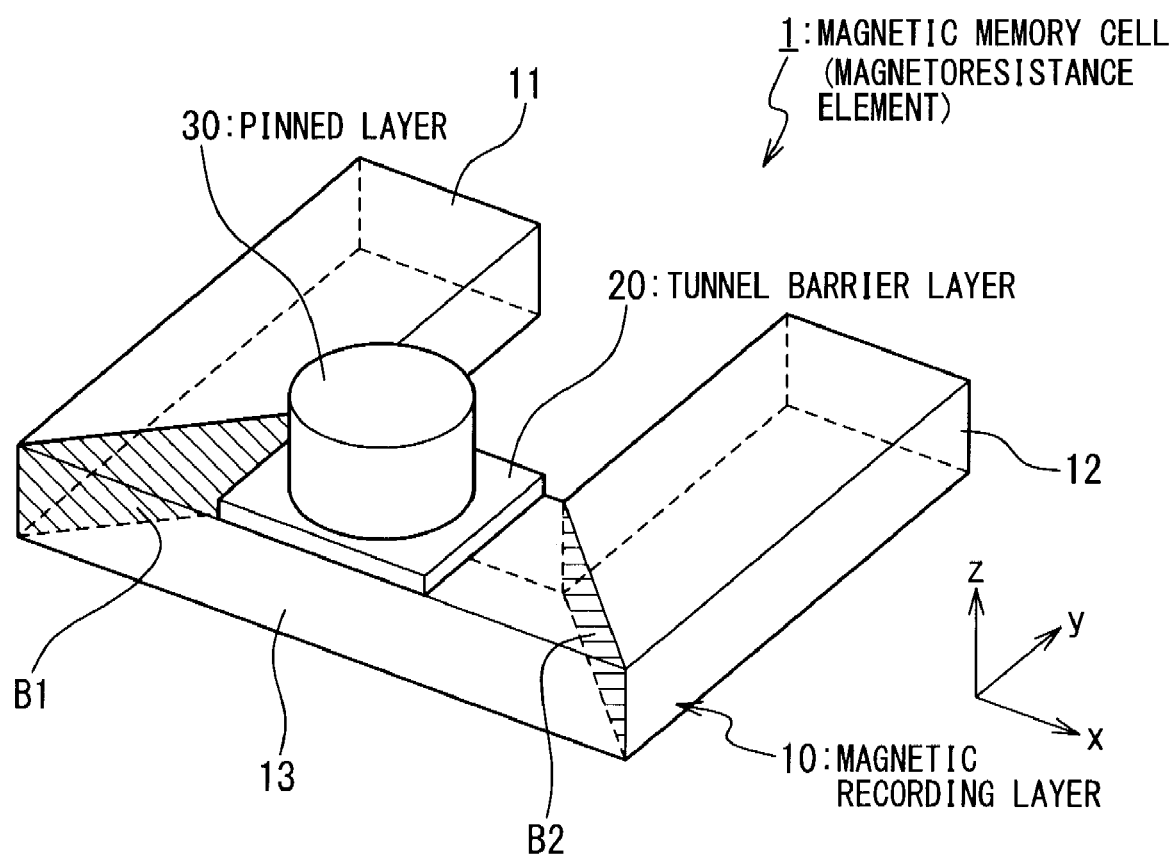
FIG. 2 is an overall view showing a structural example of a magnetic memory cell according to a first exemplary embodiment of the present invention.

1. First Exemplary Embodiment 1-1. Structure of Magnetic Memory Cell and Principle of Data Writing FIG. 2 shows an example of a magnetic memory cell 1 (magnetoresistance element) according to a first exemplary embodiment. The magnetic memory cell 1 is provided with a magnetic recording layer 10 and a pinned layer 30 that are ferromagnetic layers and a tunnel barrier layer 20 that is a non-magnetic layer. The tunnel barrier layer 20 is sandwiched between the magnetic recording layer 10 and the pinned layer 30, and the magnetic recording layer 10, the tunnel barrier layer 20 and the pinned layer 30 form an MTJ (magnetic tunnel junction).

The tunnel barrier layer 20 is a thin insulating layer, which is formed by oxidizing an Al film, for example.

The pinned layer 30 is a laminated film made of CoFe/Ru/CoFe/PtMn for example, and the magnetization direction thereof is fixed. The magnetic recording layer 10 plays a role corresponding to a free layer. The magnetic recording layer 10 is made of soft magnetic material. The magnetic recording layer 10 includes at least one element selected from the group consisting of Co, Fe and Ni. For example, the magnetic recording layer 10 is made of CoFe.

As shown in FIG. 2, the magnetic recording layer 10 according to the present exemplary embodiment includes three different regions; a first magnetization fixed region 11, a second magnetization fixed region 12 and a magnetization switching region 13. The first magnetization fixed region 11 is so formed as to extend in a Y direction, and the magnetization direction thereof is fixed. Similarly, the second magnetization fixed region 12 is so formed as to extend in the Y direction, and the magnetization direction thereof is fixed. On the other hand, the magnetization switching region 13 is so formed as to extend in an X direction and has reversible magnetization. Also, the magnetization switching region 13 is so formed as to face the pinned layer 30. In other words, a part of the magnetization switching region 13 of the magnetic recording layer 10 is connected to the pinned layer 30 through the tunnel barrier layer 20.

Figure 3:
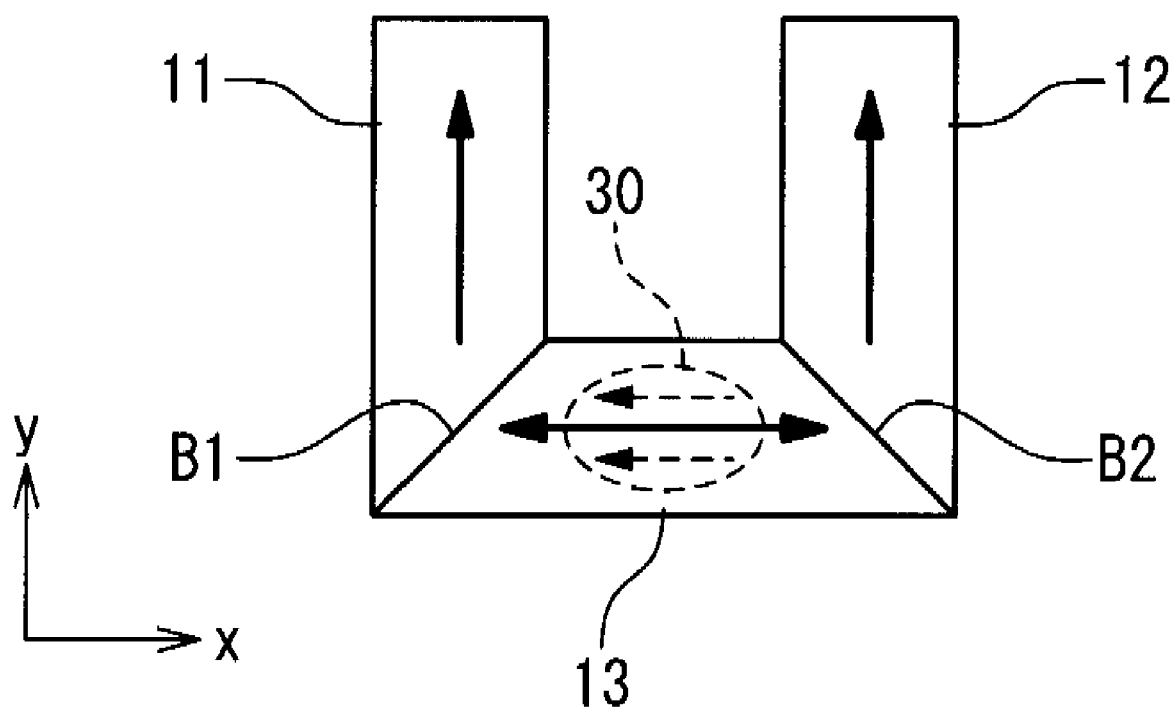
FIG. 3 is a plan view showing the structure of the magnetic memory cell shown in FIG. 2.

The above-mentioned first magnetization fixed region 11, the second magnetization fixed region 12 and the magnetization switching region 13 are formed in the same plane (i.e. XY plane). A shape of the magnetic recording layer 10 in the XY plane is shown in FIG. 3. According to the present exemplary embodiment, as shown in FIG. 3, the first magnetization fixed region 11 and the second magnetization fixed region 12 are so formed along the Y direction as to be substantially parallel to each other. The magnetization switching region 13 is so formed along the X direction as to connect between the first magnetization fixed region 11 and the second magnetization fixed region 12. The first magnetization fixed region 11 and the magnetization switching region 13 are in contact with each other at a first boundary B1, while the second magnetization fixed region 12 and the magnetization switching region 13 are in contact with each other at a second boundary B2. In the magnetization switching region 13, the first boundary B1 and the second boundary B2 are at opposed positions. That is to say, the first and second magnetization fixed regions 11 and 12 and the magnetization switching region 13 in FIG. 3 are formed to have a "U-shape or concave shape".

The magnetization direction in each region is also indicated by an arrow in FIG. 3. Moreover, projection of the pinned layer 30 and the magnetization direction thereof are also indicated by a dotted line and a dotted arrow, respectively. Let us consider a case where the magnetization direction of the pinned layer 30 is fixed to the −X direction. In FIG. 3, the magnetization direction of the first magnetization fixed region 11 is fixed to the +Y direction. The direction is the one away from the first boundary B1. Also, the magnetization direction of the second magnetization fixed region 12 is fixed to the +Y direction. The direction is the one away from the second boundary B2. That is to say, the first magnetization fixed region 11 and the second magnetization fixed region 12 are both formed such that the magnetization directions thereof are away from the magnetization switching region 13. This means that the magnetization direction of the first magnetization fixed region 11 and the magnetization direction of the second magnetization fixed region 12 are opposite along the shape of the magnetic recording layer 10. It should be noted that "the fixation of the magnetization" will be described later (refer to Section 1-3).

On the other hand, the magnetization direction of the magnetization switching region 13 is reversible, and can be either the +X direction or the −X direction. In other words, the magnetization of the magnetization switching region 13 is allowed to be parallel or anti-parallel to the magnetization of the pinned layer 30. In a case where the magnetization direction of the magnetization switching region 13 is the +X direction, namely, the magnetization is directed toward the second boundary B2, the first magnetization fixed region 11 forms one magnetic domain while the magnetization switching region 13 and the second magnetization fixed region 12 form another magnetic domain. In this case, a "domain wall" is formed at the first boundary B1. On the other hand, in a case where the magnetization direction of the magnetization switching region 13 is the −X direction, namely, the magnetization is directed toward the first boundary B1, the first magnetization fixed region 11 and the magnetization switching region 13 form one magnetic domain while the second magnetization fixed region 12 forms another magnetic domain. In this case, the domain wall is formed at the second boundary B2.

As described above, the magnetization of the magnetization switching region 13 is directed to either the first boundary B1 or the second boundary B2, and the domain wall is formed at either the first boundary B1 or the second boundary B2 in the magnetic recording layer 10. This is because the magnetization direction of the first magnetization fixed region 11 and the magnetization direction of the second magnetization fixed region 12 are opposite along the shape of the magnetic recording layer 10.

Described below will be a principle of data writing with respect to the magnetic memory cell 1. According to the present exemplary embodiment, the data writing is achieved by the spin transfer method (Spin Transfer Data Writing).

FIRST STRUCTURAL EXAMPLE

Figure 4:
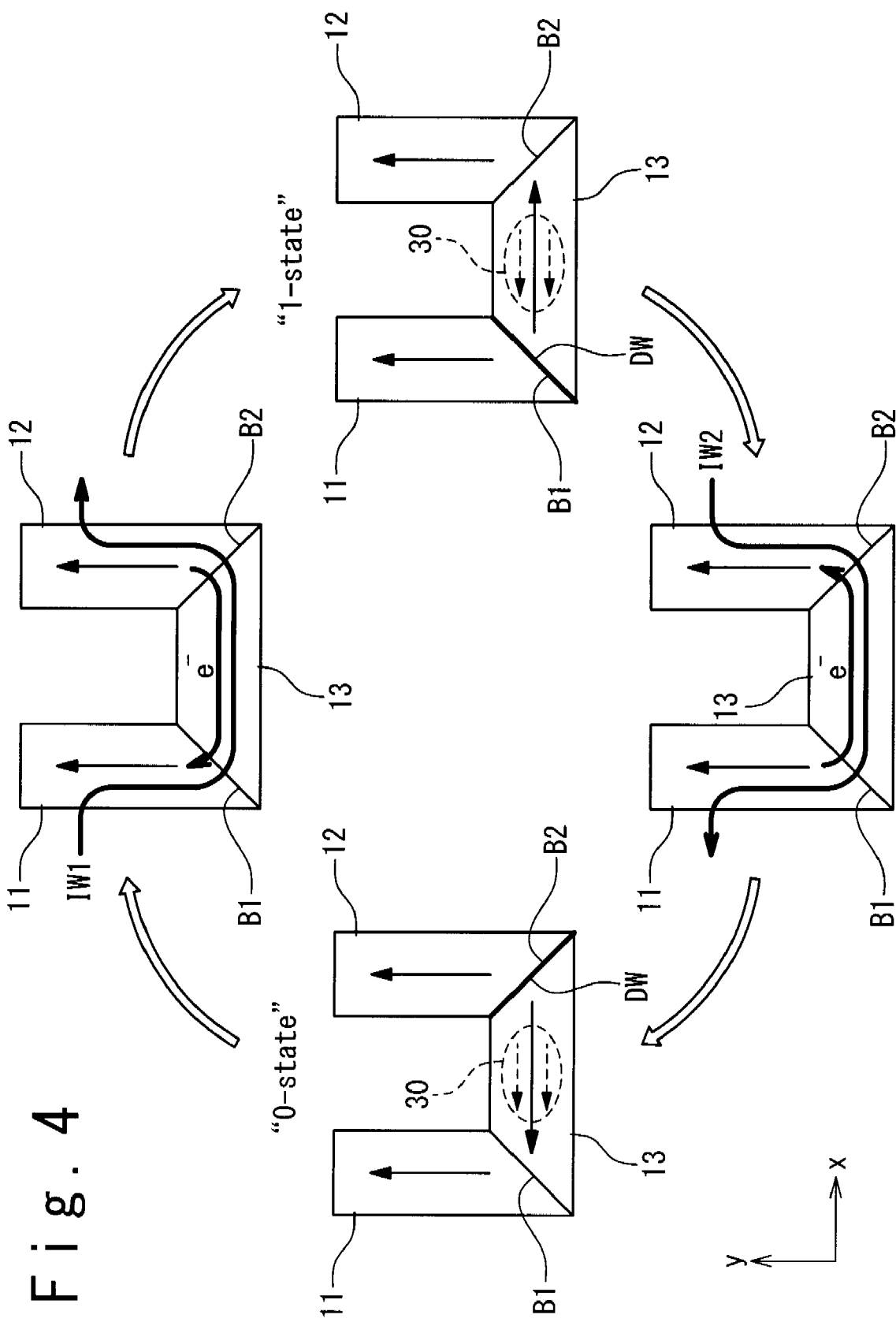
FIG. 4 is a plan view showing a principle of data writing for the magnetic memory cell shown in FIG. 3.

FIG. 4 shows a principle of data writing for the structure shown in FIG. 3. A state in which the magnetization directions of the magnetization switching region 13 and the pinned layer 30 are parallel to each other is related to data "0". In the data "0" state, the magnetization direction of the magnetization switching region 13 is the −X direction, and the domain wall DW exists at the second boundary B2. On the other hand, a sate in which the magnetization directions of the magnetization switching region 13 and the pinned layer 30 are anti-parallel to each other is related to data "1". In the data "1" state, the magnetization direction of the magnetization switching region 13 is the +X direction, and the domain wall DW exists at the first boundary B1.

In the present exemplary embodiment, a write current IW is flowed not in a direction penetrating through the MTJ but planarly in the magnetic recording layer 10. More specifically, at a time of writing the data "1" (first write operation), a first write current IW1 is flowed from the first magnetization fixed region 11 to the second magnetization fixed region 12 through the magnetization switching region 13. In this case, electrons (spin electrons) are injected from the second magnetization fixed region 12 into the magnetization switching region 13. The spin of the injected electrons affects a magnetic moment of the magnetization switching region 13. As a result, the magnetization direction of the magnetization switching region 13 is switched to a direction toward the second boundary B2. That is to say, the magnetization of the magnetization switching region 13 is reversed due to the spin transfer effect and the magnetization direction thereof is changed to the +X direction (Spin Transfer Magnetization Switching).

On the other hand, at a time of writing the data "0" (second write operation), a second write current IW2 is flowed from the second magnetization fixed region 12 to the first magnetization fixed region 11 through the magnetization switching region 13. In this case, electrons are injected from the first magnetization fixed region 11 into the magnetization switching region 13. As a result, the magnetization of the magnetization switching region 13 is reversed and the magnetization direction thereof is changed to the −X direction. In this manner, according to the present exemplary embodiment, the magnetization direction of the magnetization switching region 13 is switched by the write currents IW1 and IW2 which flows planarly in the magnetic recording layer 10. The first magnetization fixed region 11 and the second magnetization fixed region 12 serve as supply sources of the electrons having different spins.

The aforementioned write operation can also be described from a viewpoint of "domain wall motion". At the time of writing the data "1", electrons move from the second magnetization fixed region 12 toward the first magnetization fixed region 11. At this time, the domain wall DW moves from the second boundary B2 to the first boundary B1 in accordance with the electron moving direction. On the other hand, at the time of writing the data "0", electrons move from the first magnetization fixed region 11 toward the second magnetization fixed region 12. At this time, the domain wall DW moves from the first boundary B1 to the second boundary B2 in accordance with the electron moving direction. That is to say, the domain wall DW in the magnetic recording layer 10 moves back and forth like a "seesaw or flowmeter" between the first boundary B1 and the second boundary B2 in accordance with the electron moving direction. Since the domain wall DW moves within the magnetization switching region 13, the magnetization switching region 13 can be called a "domain wall moving region". It can also be said that the magnetic memory cell 1 according to the present exemplary embodiment stores data on the basis of the position of the domain wall DW.

It is desirable from a viewpoint of the domain wall motion to suppress crystal defects in the magnetization switching region 13. It is therefore preferable that at least the magnetization switching region 13 is made of an amorphous or microcrystalline soft magnetic material. Here, microcrystalline means that the grain diameter is nor more than a film thickness of the magnetization switching region 13. More specifically, composition of the magnetization switching region 13 is represented by XX-YY-ZZ. In this case, the XX includes at least one element selected from the group consisting of Co, Fe and Ni. The YY includes at least one element selected from the group consisting of Al, Si, Mg, Ta, Nb, Zr, Hf, W, Mo, Ti and V. The ZZ includes at least one element selected from the group consisting of N, C, B and O. Also, the composition of the magnetization switching region 13 can be represented by XX-YY. The XX and the YY are as descried above. Moreover, the composition of the magnetization switching region 13 may be represented by XX-ZZ. The XX and the ZZ are as described above. Due to such the composition, the magnetization switching region 13 becomes amorphous or microcrystalline. As a result, the crystal defects in the magnetization switching region 13 are suppressed, which makes it possible for the domain wall DW to move smoothly.

As described above, since the write currents IW1 and IW2 do not penetrate through the MTJ, deterioration of the tunnel barrier layer 20 in the MTJ can be suppressed. Moreover, since the data writing is achieved by the spin transfer method, the write currents IW1 and IW2 can be decreased with the reduction of the size of the memory cell. Furthermore, since a moving distance of the domain wall DW becomes shorter with the reduction of the size of the memory cell, the write speed can be increased with the miniaturization of the memory cell.

A data read operation is as follows. At the time of data reading, a read current is so supplied as to flow between the pinned layer 30 and the magnetization switching region 13. For example, the read current is flowed from any of the first magnetization fixed region 11 and the second magnetization fixed region 12 to the pinned layer 30 through the magnetization switching region 13 and the tunnel barrier layer 20. Alternatively, the read current is flowed from the pinned layer 30 to any of the first magnetization fixed region 11 and the second magnetization fixed region 12 through the tunnel barrier layer 20 and the magnetization switching region 13. Based on the read current or a read potential, a resistance value of the magnetoresistance element is detected and the magnetization direction of the magnetization switching region 13 is sensed.

SECOND STRUCTURAL EXAMPLE

Figure 5:
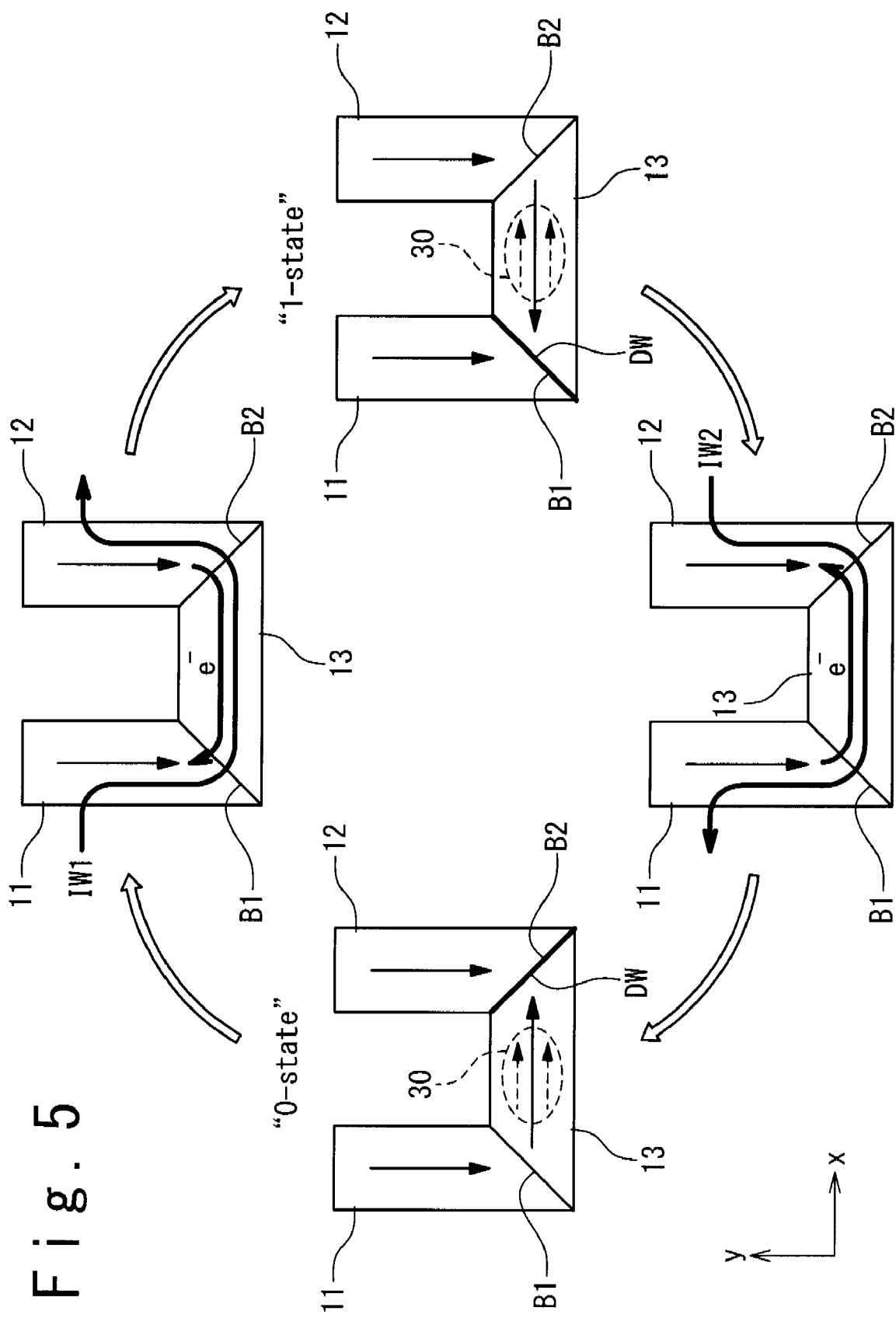
FIG. 5 is a plan view showing another structural example of a magnetic memory cell according to the first exemplary embodiment and a principle of data writing for the magnetic memory cell.

The magnetization direction of the first magnetization fixed region 11 and the magnetization direction of the second magnetization fixed region 12 are not limited to those shown in FIGS. 3 and 4. The magnetization direction of the first magnetization fixed region 11 and the magnetization direction of the second magnetization fixed region 12 just need to be opposite along the shape of the magnetic recording layer 10. Another structure according to the present exemplary embodiment and a principle of data writing with respect to the structure are shown in FIG. 5. FIG. 5 is a diagram corresponding to FIG. 4, and an overlapping description will be omitted as appropriate.

The magnetization direction of the first magnetization fixed region 11 is fixed to the −Y direction. The direction is the one toward the first boundary B1. Also, the magnetization direction of the second magnetization fixed region 12 is fixed to the −Y direction. The direction is the one toward the second boundary B2. That is to say, the magnetization of the first magnetization fixed region 11 and the magnetization of the second magnetization fixed region 12 are both fixed to a direction toward the magnetization switching region 13 and are opposite along the shape of the magnetic recording layer 10. Also, the magnetization direction of the pinned layer 30 is fixed to the +X direction. In the data "0" state, the magnetization direction of the magnetization switching region 13 is the +X direction, and the domain wall DW exists at the second boundary B2. In the data "1" state, on the other hand, the magnetization direction of the magnetization switching region 13 is the −X direction, and the domain wall DW exists at the first boundary B1.

At a time of writing the data "1" (first write operation), a first write current IW1 is flowed from the first magnetization fixed region 11 to the second magnetization fixed region 12 through the magnetization switching region 13. In this case, electrons are injected from the second magnetization fixed region 12 into the magnetization switching region 13. As a result, the magnetization of the magnetization switching region 13 is reversed, and the magnetization direction thereof is changed to the −X direction. The domain wall DW moves from the second boundary B2 to the first boundary B1 in accordance with the electron moving direction. On the other hand, at a time of writing the data "0" (second write operation), a second write current IW2 is flowed from the second magnetization fixed region 12 to the first magnetization fixed region 11 through the magnetization switching region 13. In this case, electrons are injected from the first magnetization fixed region 11 into the magnetization switching region 13. As a result, the magnetization of the magnetization switching region 13 is reversed, and the magnetization direction thereof is changed to the +X direction. The domain wall DW moves from the first boundary B1 to the second boundary B2 in accordance with the electron moving direction.

The same effects as in the foregoing first structural example can also be obtained by the structure shown in FIG. 5. The data reading is also the same as in the foregoing first structural example.

THIRD STRUCTURAL EXAMPLE

Figure 6:
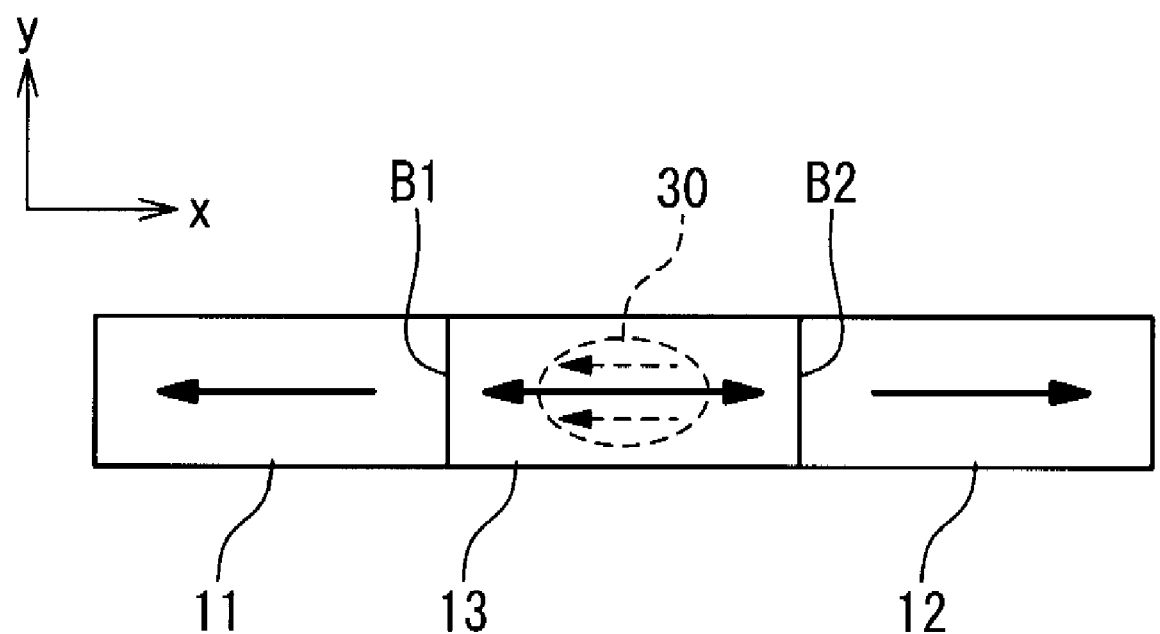
FIG. 6 is a plan view showing still another structural example of a magnetic memory cell according to the first exemplary embodiment.

The arrangement of the first magnetization fixed region 11, the second magnetization fixed region 12 and the magnetization switching region 13 is not limited to the foregoing ones. Another example of the shape of the magnetic recording layer 10 in the XY plane is shown in FIG. 6. In FIG. 6, the first and second magnetization fixed regions 11 and 12 and the magnetization switching region 13 are "linearly" formed. That is to say, the first magnetization fixed region 11 and the second magnetization fixed region 12 are so formed along the X direction as to be substantially parallel to each other. The magnetization switching region 13 is so formed along the X direction as to connect between the first magnetization fixed region 11 and the second magnetization fixed region 12.

The magnetization direction of the first magnetization fixed region 11 is fixed to the −X direction. The direction is the one away from the first boundary B1. Also, the magnetization direction of the second magnetization fixed region 12 is fixed to the +X direction. The direction is the one away from the second boundary B2. That is to say, the magnetization of the first magnetization fixed region 11 and the magnetization of the second magnetization fixed region 12 are both fixed to directions away from the magnetization switching region 13 and are opposite to each other. It should be noted that "the fixation of the magnetization" will be described later (refer to Section 1-3). The magnetization direction of the magnetization switching region 13 is reversible, and can be either the +X direction or the −X direction. The magnetization direction of the pinned layer 30 is fixed to the −X direction.

FIG. 7 shows a principle of data writing for the structure shown in FIG. 6. A state in which the magnetization directions of the magnetization switching region 13 and the pinned layer 30 are parallel to each other is related to data "0". In the data "0" state, the magnetization direction of the magnetization switching region 13 is the −X direction, and the domain wall DW exists at the second boundary B2. On the other hand, a sate in which the magnetization directions of the magnetization switching region 13 and the pinned layer 30 are anti-parallel to each other is related to data "1".

In the data "1" state, the magnetization direction of the magnetization switching region 13 is the +X direction, and the domain wall DW exists at the first boundary B1.

At a time of writing the data "1" (first write operation), a first write current IW1 is flowed from the first magnetization fixed region 11 to the second magnetization fixed region 12 through the magnetization switching region 13. In this case, electrons are injected from the second magnetization fixed region 12 into the magnetization switching region 13. As a result, the magnetization of the magnetization switching region 13 is reversed, and the magnetization direction thereof is changed to the +X direction. The domain wall DW moves from the second boundary B2 to the first boundary B1 in accordance with the electron moving direction. On the other hand, at a time of writing the data "0" (second write operation), a second write current IW2 is flowed from the second magnetization fixed region 12 to the first magnetization fixed region 11 through the magnetization switching region 13. In this case, electrons are injected from the first magnetization fixed region 11 into the magnetization switching region 13. As a result, the magnetization of the magnetization switching region 13 is reversed, and the magnetization direction thereof is changed to the −X direction. The domain wall DW moves from the first boundary B1 to the second boundary B2 in accordance with the electron moving direction.

The same effects as in the foregoing first structural example can also be obtained by the structure shown in FIG. 7. The data reading is also the same as in the foregoing first structural example.

FOURTH STRUCTURAL EXAMPLE

The magnetization direction of the first magnetization fixed region 11 and the magnetization direction of the second magnetization fixed region 12 are not limited to those shown in FIGS. 6 and 7. Another structure according to the present exemplary embodiment and a principle of data writing with respect to the structure are shown in FIG. 8. FIG. 8 is a diagram corresponding to FIG. 7, and an overlapping description will be omitted as appropriate.

The first and second magnetization fixed regions 11 and 12 and the magnetization switching region 13 are "linearly" formed. The magnetization direction of the first magnetization fixed region 11 is fixed to the +X direction. The direction is the one toward the first boundary B1. Also, the magnetization direction of the second magnetization fixed region 12 is fixed to the −X direction. The direction is the one toward the second boundary B2. That is to say, the magnetization of the first magnetization fixed region 11 and the magnetization of the second magnetization fixed region 12 are both fixed to directions toward the magnetization switching region 13 and are opposite to each other. Also, the magnetization direction of the pinned layer 30 is fixed to the +X direction. In the data "0" state, the magnetization direction of the magnetization switching region 13 is the +X direction, and the domain wall DW exists at the second boundary B2. On the other hand, in the data "1" state, the magnetization direction of the magnetization switching region 13 is the −X direction, and the domain wall DW exists at the first boundary B1.

At a time of writing the data "1" (first write operation), a first write current IW1 is flowed from the first magnetization fixed region 11 to the second magnetization fixed region 12 through the magnetization switching region 13. In this case, electrons are injected from the second magnetization fixed region 12 into the magnetization switching region 13. As a result, the magnetization of the magnetization switching region 13 is reversed, and the magnetization direction thereof is changed to the −X direction. The domain wall DW moves from the second boundary B2 to the first boundary B1 in accordance with the electron moving direction. On the other hand, at a time of writing the data "0" (second write operation), a second write current IW2 is flowed from the second magnetization fixed region 12 to the first magnetization fixed region 11 through the magnetization switching region 13. In this case, electrons are injected from the first magnetization fixed region 11 into the magnetization switching region 13. As a result, the magnetization of the magnetization switching region 13 is reversed, and the magnetization direction thereof is changed to the +X direction. The domain wall DW moves from the first boundary B1 to the second boundary B2 in accordance with the electron moving direction.

The same effects as in the foregoing first structural example can also be obtained by the structure shown in FIG. 8. The data reading is also the same as in the foregoing first structural example.

FIFTH STRUCTURAL EXAMPLE

In the case where the magnetic recording layer 10 is formed in a linear shape, it is desirable to stably hold the domain wall DW at the boundary B1 or B2. From a viewpoint of energy, the domain wall becomes more stable as the area thereof becomes smaller. Therefore, structures such as shown in FIGS. 9A to 9D can be considered as the structure of the magnetic recording layer 10.

Figure 9A:
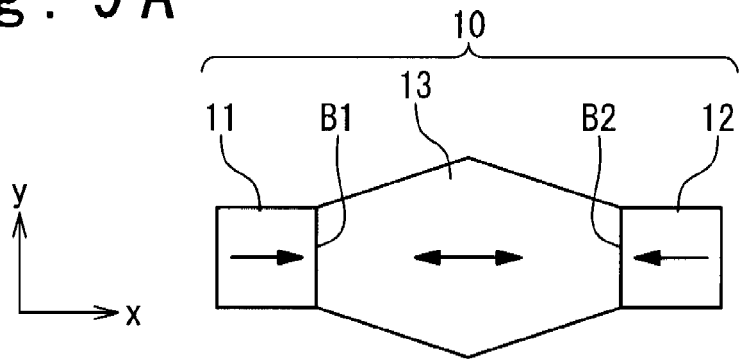
FIG. 9A is a plan view showing still another structural example of the magnetic recording layer according to the first exemplary embodiment.
Figure 9B:
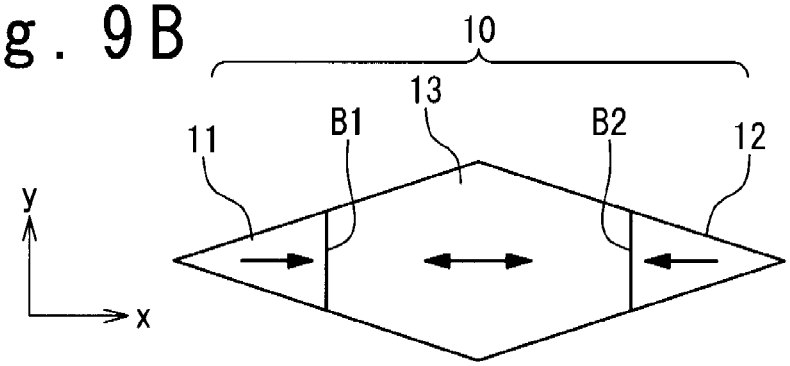
FIG. 9B is a plan view showing still another structural example of the magnetic recording layer according to the first exemplary embodiment.
Figure 9C:
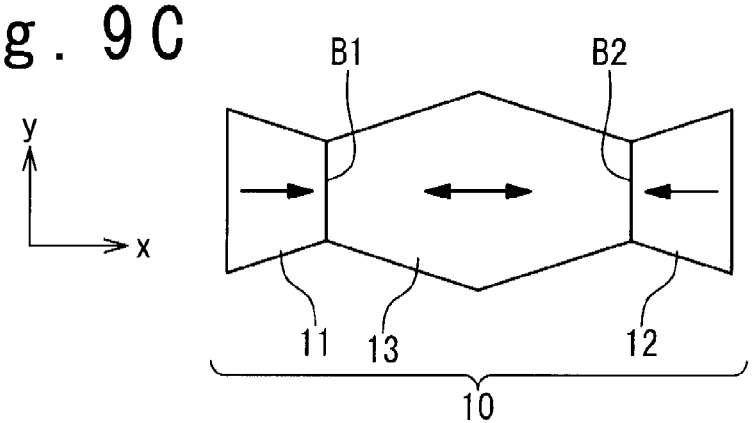
FIG. 9C is a plan view showing still another structural example of the magnetic recording layer according to the first exemplary embodiment.

FIGS. 9A to 9C are plan views showing examples of the shape of the magnetic recording layer 10. In FIGS. 9A to 9C, a width of the magnetization switching region 13 increases with distance from the first boundary B1 and the second boundary B2. That is to say, the magnetization switching region 13 is formed to be widest in its central portion. The thickness may be largest at the central portion, instead of the width in the XY plane. The point is that a "cross-sectional area" of the magnetization switching region 13 in a plane (YZ plane) parallel to the boundaries B1 and B2 increases with distance from the boundaries B1 and B2. Consequently, the domain wall DW is likely to move toward the boundary B1 or the boundary B2 unless acted upon by an external force. Whereas, the magnetizations of the first magnetization fixed region 11 and the second magnetization fixed region 12 are fixed, which prevents the motion of the domain wall. Therefore, the domain wall becomes stable at either the first boundary B1 or the second boundary B2.

In FIG. 9A, cross-sectional areas of the magnetization fixed regions 11 and 12 are constant and equal to the areas of the boundaries B1 and B2. In other words, the cross-sectional areas of the magnetization fixed regions 11 and 12 are smaller than the cross-sectional area of the magnetization switching region 13. In FIG. 9B, the cross-sectional areas of the magnetization fixed regions 11 and 12 become smaller outwards, and the magnetic recording layer 10 as a whole is formed in a diamond shape. In this case, it is easy to fabricate the magnetic recording layer 10. In FIG. 9C, on the other hand, the cross-sectional areas of the magnetization fixed regions 11 and 12 become larger outwards. In this case, the stability of the domain wall is further enhanced.

Figure 9D:
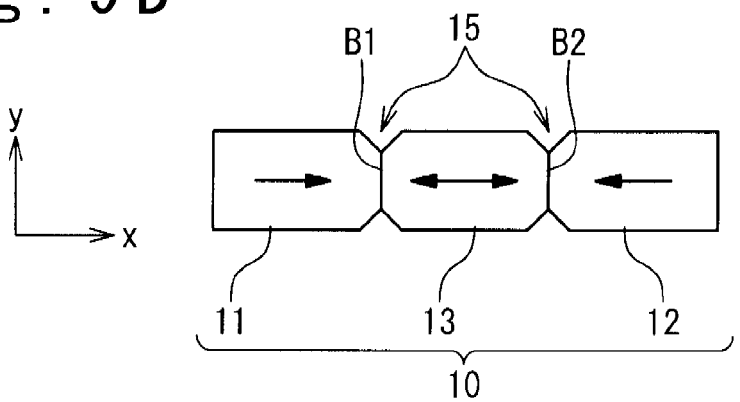
FIG. 9D is a plan view showing still another structural example of the magnetic recording layer according to the first exemplary embodiment.

In FIG. 9D, cross-sectional areas of the magnetization fixed regions 11, 12 and the magnetization switching region 13 are roughly constant. However, notches 15 are provided on the lateral part of the magnetic recording layer 10, and the areas of the boundaries B1 and B2 are smaller than the other portion. As a result, the domain wall can be held at the boundaries B1 and B2. It should be noted in the case of the structure shown in FIG. 9D that the size of the notch 15 is equal to the minimum feature size at the minimum and hence an area of the whole of the magnetic recording layer 10 becomes very large. From a viewpoint of the area and the manufacturing process, the structures shown in FIGS. 9A to 9C are preferable.

In the magnetic memory cell 1 according to the present exemplary embodiment, as described above, the magnetic recording layer 10 includes the first magnetization fixed region 11, the second magnetization fixed region 12 and the magnetization switching region 13. Such the structure can also be considered as follows. That is, a "first magnetization fixed section" corresponding to the first magnetization fixed region 11 and a "second magnetization fixed section" corresponding to the second magnetization fixed region 12 are added to a usual magnetoresistance element. The usual magnetoresistance element is provided with a free layer, a pinned layer, and a non-magnetic layer sandwiched therebetween. The free layer, the first magnetization fixed section and the second magnetization fixed section are formed in the same plane. The first magnetization fixed section is connected to the first boundary B1 of the free layer, while the second magnetization fixed section is connected to the second boundary B2 of the free layer. Both of the magnetization direction (first direction) of the first magnetization fixed section and the magnetization direction (second direction) of the second magnetization fixed section are toward the free layer or away from the free layer. By a write current planarly flowing between the first magnetization fixed section and the second magnetization fixed section, the domain wall moves between the first boundary B1 and the second boundary B2, and the magnetization of the free layer is switched.

1-2. Circuit Configuration

Figure 10A:
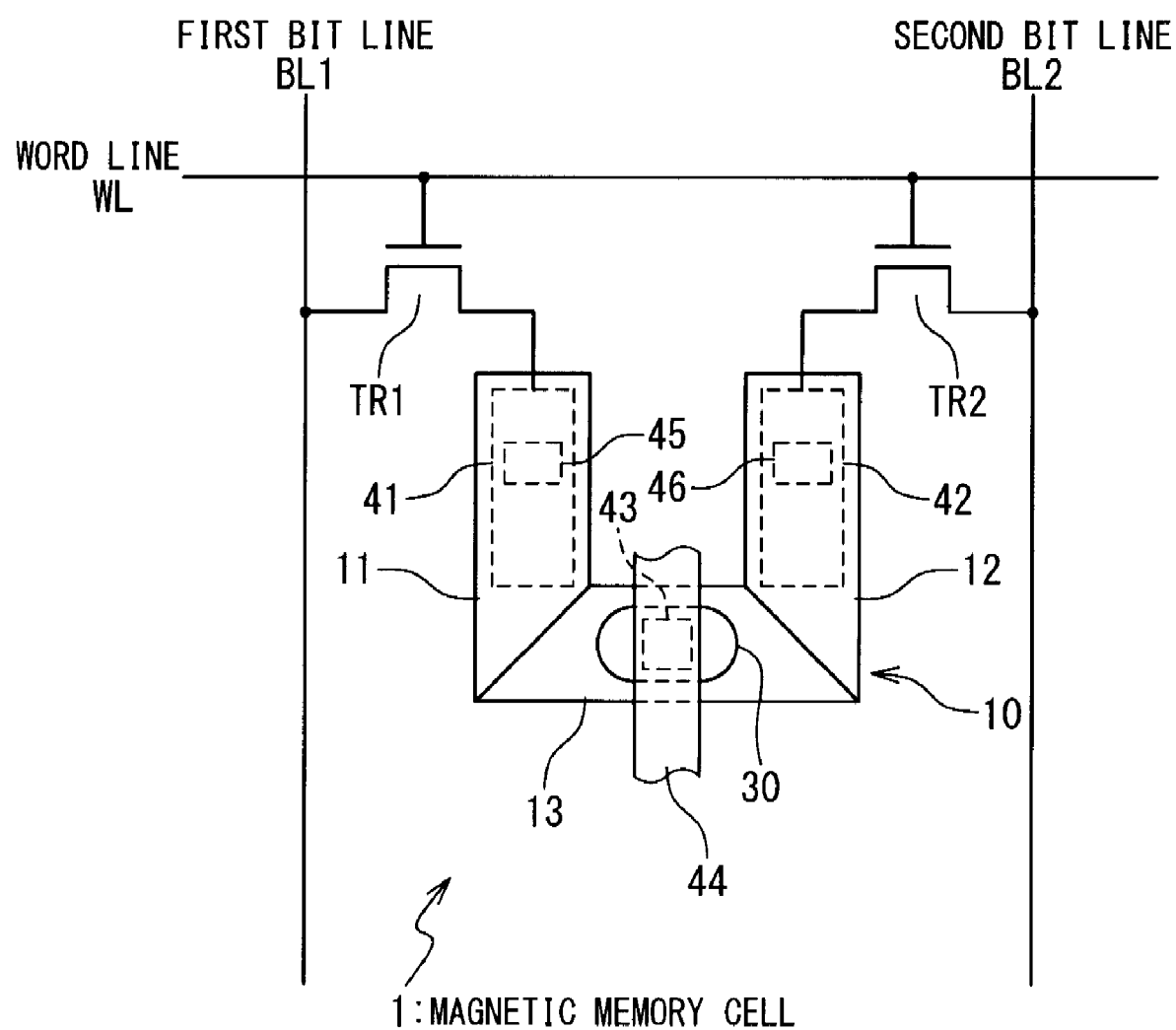
FIG. 10A is a plan view schematically showing a circuit configuration of the magnetic memory cell according to the first exemplary embodiment.

Next, a circuit configuration for supplying the write currents IW1 and IW2 to the magnetic memory cell 1 according to the present exemplary embodiment will be explained below. FIG. 10A is a plan view showing an example of a circuit configuration of the magnetic memory cell 1. Also, FIG. 10B is a cross-sectional view schematically showing a structure of the magnetic memory cell 1 shown in FIG. 10A.

The first magnetization fixed region 11 of the magnetic recording layer 10 is connected to a first lower electrode 41 via a through hall 45, and the second magnetization fixed region 12 is connected to a second lower electrode 42 via a through hall 46. The first lower electrode 41 is connected to one of source/drain of a first transistor TR1, and the other of source/drain of the first transistor TR1 is connected to a first bit line BL1. Also, the second lower electrode 42 is connected to one of source/drain of a second transistor TR2, and the other of source/drain of the second transistor TR2 is connected to a second bit line BL2. A gate of the first transistor TR1 and a gate of the second transistor TR2 are connected to a word line WL.

The pinned layer 30 is formed on the magnetization switching region 13 of the magnetic recording layer 10 through the tunnel barrier layer 20. An upper electrode 43 is formed on the pinned layer 30, and a read line 44 is connected to the upper electrode 43. A direction of the read line 44 is arbitrary. The read line 44 can be connected to a selection transistor or the ground.

FIG. 11 shows a summary of the data read and write method in the case of the circuit configuration shown in FIG. 10A and FIG. 10B. In both of the writing and reading, a word line WL connected to a target memory cell is selected and its potential is set to "High". Consequently, the first transistor TR1 and the second transistor TR2 are turned ON.

In the case of the data "1" writing, potentials of the first bit line BL1 and the second bit line BL2 are set to "High" and "Low", respectively. As a result, the first write current IW1 flows from the first bit line BL1 to the second bit line BL2 through the first transistor TR1, the magnetic recording layer 10 and the second transistor TR2. In the case of the data "0" writing, on the other hand, potentials of the first bit line BL1 and the second bit line BL2 are set to "Low" and "High", respectively. As a result, the second write current IW2 flows from the second bit line BL2 to the first bit line BL1 through the second transistor TR2, the magnetic recording layer 10 and the first transistor TR1.

At the time of data reading, for example, the potential of the first bit line BL1 is set to "High" while the second bit line BL2 is set to "Open". Consequently, the read current flows from the first bit line BL1 to the read line 44 through the first transistors TR1 and the MTJ. Alternatively, the first bit line BL1 is set to "Open" while the potential of the second bit line BL2 is set to "High". Consequently, the read current flows from the second bit line BL2 to the read line 44 through the second transistors TR2 and the MTJ.

Peripheral circuits for controlling the above-mentioned word line WL, the first bit line BL1 and the second bit line BL2 can be designed appropriately by a person skilled in the art. One example of a configuration of the peripheral circuits is shown in FIG. 12.

Figure 12:
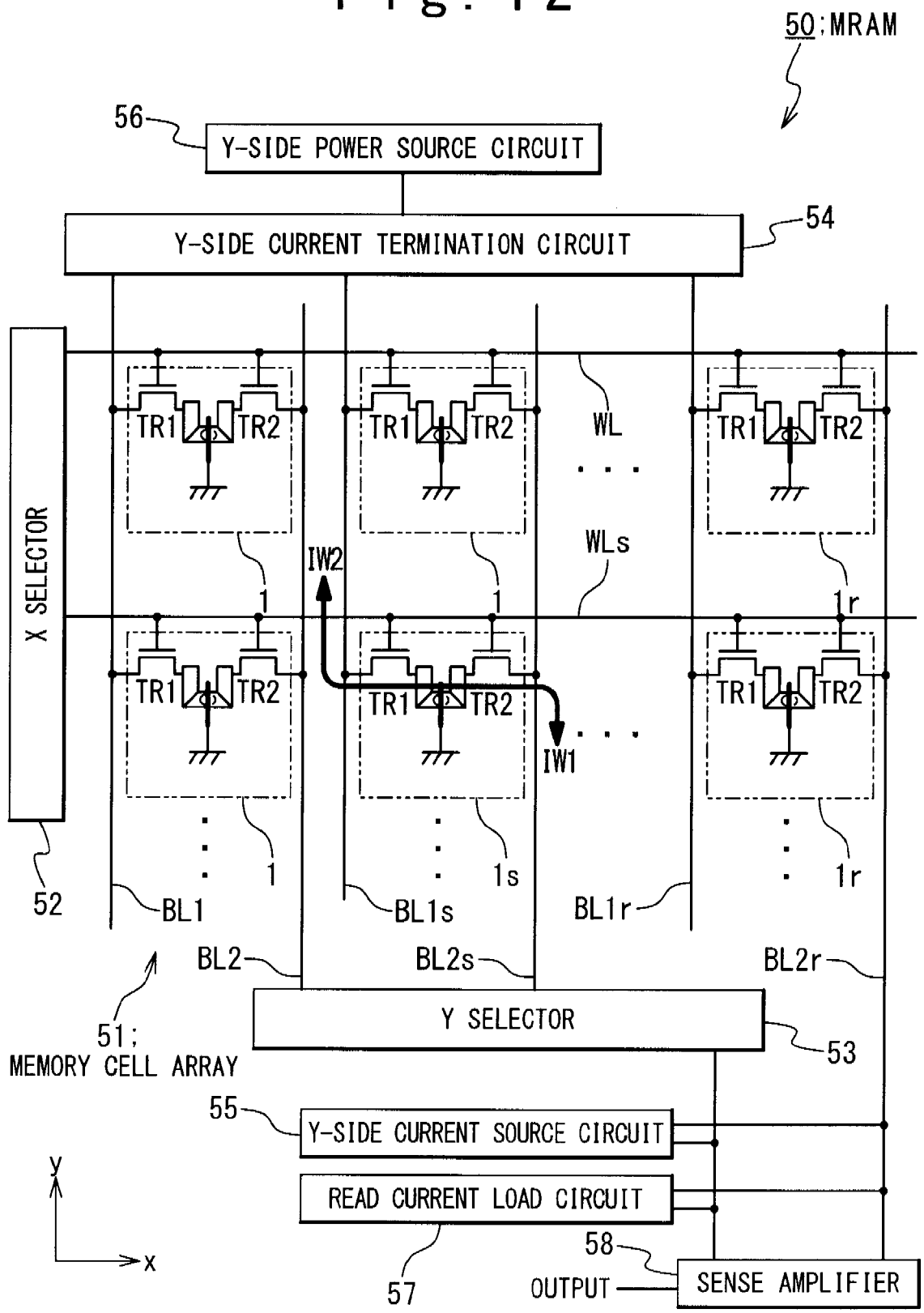
FIG. 12 is a circuit block diagram showing an example of a circuit configuration of an MRAM according to the first exemplary embodiment.

In FIG. 12, an MRAM 50 has a memory cell array 51 in which the above-described magnetic memory cells 1 are arranged in a matrix form. The memory cell array 51 includes not only the magnetic memory cells 1 used for the data recording but also reference cells 1r which are referred to at the time of data reading. A basic structure of the reference cell 1r is the same as that of the magnetic memory cell 1. Let us consider a case where the above-mentioned read line 44 is connected to the ground line in each magnetic memory cell 1. Also, one word line and a pair of bit lines (the first bit line BL1 and the second bit line BL2) are provided for each magnetic memory cell 1, as described above.

A plurality of word lines WL are connected to an X selector 52. In any of the data writing and reading, the X selector 52 selects one word line WL connected to a target memory cell is as a selected word line WLs out of the plurality of word lines WL.

A plurality of first bit lines BL1 are connected to a Y-side current termination circuit 54, and a plurality of second bit lines BL2 are connected to a Y selector 53. In the data writing, the Y selector 53 selects one second bit line BL2 connected to the target memory cell is as a selected second bit line BL2s out of the plurality of second bit lines BL2. In the data writing, the Y-side current termination circuit 54 selects one first bit line BL1 connected to the target memory cell is as a selected first bit line BL1s out of the plurality of first bit lines BL1. In this manner, the target memory cell 1s is selected.

A Y-side current source circuit 55 is a current source for supplying or drawing a predetermined write current (IW1, IW2) with respect to the selected second bit line BL2s at the time of data writing. The Y-side current source circuit 55 includes a current selector unit for determining the direction of the write current and a constant current source for supplying a constant current. A Y-side power source circuit 56 supplies a predetermined voltage to the Y-side current termination circuit 54 at the time of data writing. As a result, the write current IW1 or IW2 by the Y-side current source circuit 55 flows into the Y selector 53 or flows out from the Y selector 53, depending on the data to be written to the target memory cell 1s. The above-mentioned X selector 52, Y selector 53, Y-side current termination circuit 54, Y-side current source circuit 55 and Y-side power source circuit 56 constitute a "write current supply circuit" for supplying the write currents IW1 and 1W2 to the magnetic memory cells 1.

At the time of data reading, the first bit lines BL1 are set to "Open". At the time of data reading, a read current load circuit 57 supplies a predetermined read current to the selected second bit line BL2s. Also, the read current load circuit 57 supplies the predetermined current to a reference second bit line BL2r which is connected to the reference cells 1r. A sense amplifier 58 reads data from the target memory cell is based on a difference between a potential of the reference second bit line BL2r and a potential of the selected second bit line BL2s, and outputs the read data.

1-3. Magnetization Fixation

Next, methods for fixing the magnetizations of the first magnetization fixed region 11 and the second magnetization fixed region 12 will be described below. The methods for the magnetization fixation include three patterns respectively utilizing exchange coupling, magnetostatic coupling and magnetic anisotropy.

(Exchange Coupling)

Figure 13:
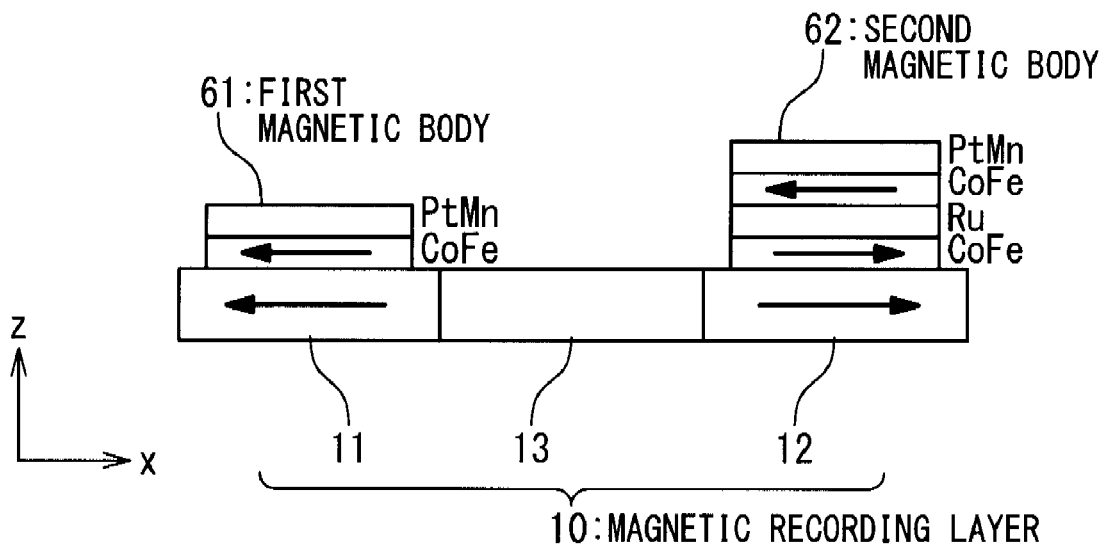
FIG. 13 is a side view showing an example of a method for fixing magnetization directions in magnetization fixed regions.

Description will be given by taking the "third structural example" shown in FIG. 6 as an example. FIG. 13 is a side view schematically showing the magnetic memory cell 1 provided with a magnetization fixing means. The magnetic memory cell 1 is provided with a first magnetic body 61 and a second magnetic body 62 which serve as the magnetization fixing means. The first magnetic body 61 applies a bias magnetic field of the −X direction to the first magnetization fixed region 11. On the other hand, the second magnetic body 62 applies a bias magnetic field of the +X direction to the second magnetization fixed region 12.

More specifically, the first magnetic body 61 includes a ferromagnetic layer having magnetization of the −X direction, and the ferromagnetic layer is formed to be in contact with the first magnetization fixed region 11. The first magnetic body 61 fixes the magnetization direction of the first magnetization fixed region 11 to the −X direction by the "exchange coupling". On the other hand, the second magnetic body 62 includes a ferromagnetic layer having magnetization of the +X direction, and the ferromagnetic layer is formed to be in contact with the second magnetization fixed region 12. The second magnetic body 62 fixes the magnetization direction of the second magnetization fixed region 12 to the +X direction by the exchange coupling.

As shown in FIG. 13, the first magnetic body 61 is a laminated film of CoFe/PtMn, for example. The laminated film structure is the one such as used in the pinned layer. As in the case of the pinned layer whose magnetization direction is fixed, the magnetization direction of the CoFe layer which serves as a source for fixing the magnetization direction of the first magnetization fixed region 11 is firmly fixed to the −X direction. Also, the second magnetic body 62 is a laminated film of CoFe/Ru/CoFe/PtMn, for example. The upper half of the structure is the same as the structure of the first magnetic body 61, and the magnetization direction of the CoFe layer is fixed to the −X direction. The lower CoFe layer is antiferromagnetically coupled with the upper CoFe layer through the Ru layer, and the magnetization direction thereof is fixed to the +X direction. The CoFe layer having the magnetization of the +X direction is contact with the second magnetization fixed region 12.

In FIG. 13, the film structures of the first magnetic body 61 and the second magnetic body 62 are different from each other, as described above. The reason is that it is necessary to apply the bias magnetic fields of opposite directions respectively to the first magnetization fixed region 11 and the second magnetization fixed region 12. Alternatively, the first magnetic body 61 and the second magnetic body 62 may be made of different materials, instead of the different film structures. Also, a similar first magnetic body 61 and a similar second magnetic body 62 can be applied to the "fourth structural example" and the "fifth structural example".

The magnetization fixation based on the exchange coupling can also be applied to the first structural example shown in FIG. 3. In this case, the magnetizations of the first magnetization fixed region 11 and the second magnetization fixed region 12 are fixed to the same +Y direction. Therefore, the first magnetic body 61 and the second magnetic body 62 can have the same film structure. For example, the first magnetic body 61 and the second magnetic body 62 are laminated films of CoFe/PtMn.

Figure 14:
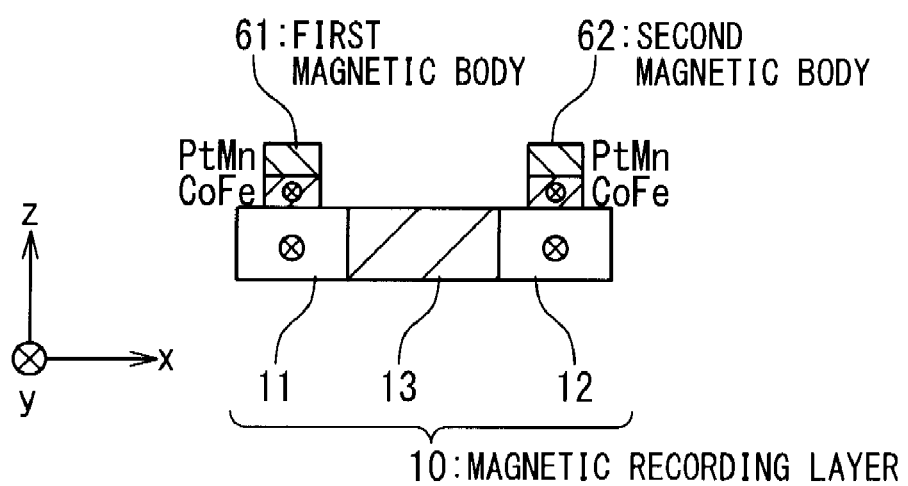
FIG. 14 is a side view showing another example of a method for fixing magnetization directions in magnetization fixed regions.

Referring to FIG. 14, the first magnetic body 61 and the second magnetic body 62 apply bias magnetic fields of the +Y direction to the first magnetization fixed region 11 and the second magnetization fixed region 12, respectively. More specifically, each of the first magnetic body 61 and the second magnetic body 62 includes a ferromagnetic layer (CoFe layer) having magnetization of the +Y direction, and the respective ferromagnetic layers are so formed as to be in contact with the first magnetization fixed region 11 and the second magnetization fixed region 12. The first magnetic body 61 and the second magnetic body 62 respectively fix the magnetization directions of the first magnetization fixed region 11 and the second magnetization fixed region 12 to the +Y direction by the exchange coupling. Also, a similar first magnetic body 61 and a similar second magnetic body 62 can be applied to the "second structural example" shown in FIG. 5.

(Magnetostatic Coupling)

Figure 15:
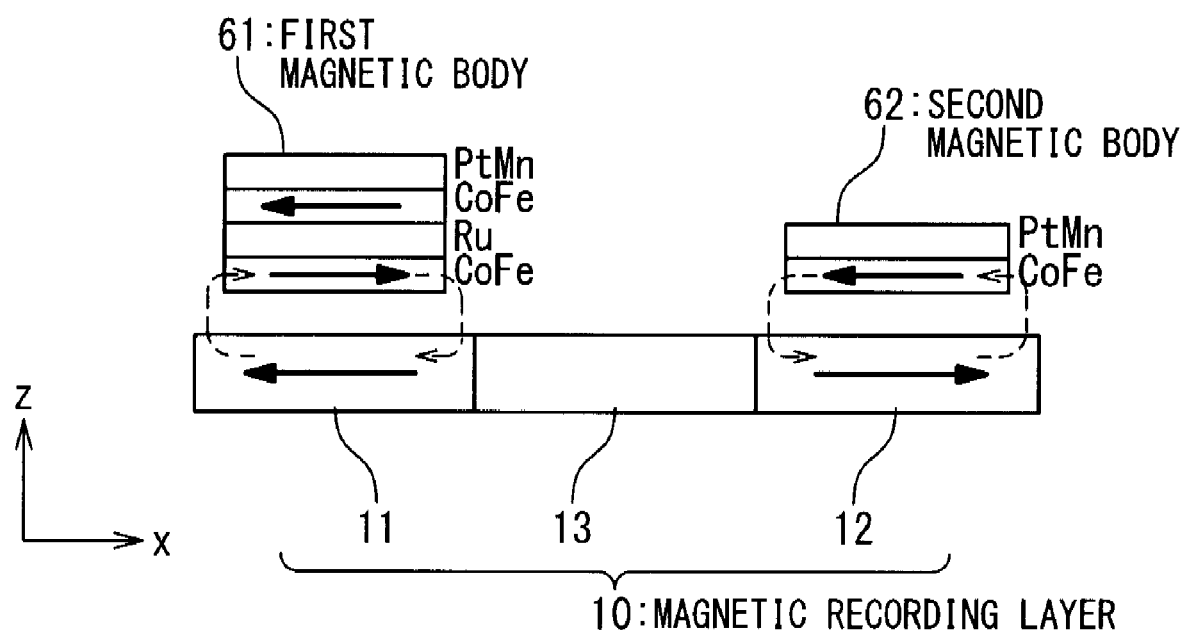
FIG. 15 is a side view showing still another example of a method for fixing magnetization directions in magnetization fixed regions.

Description will be given by taking the "third structural example" shown in FIG. 6 as an example. FIG. 15 is a side view schematically showing the magnetic memory cell 1 provided with a magnetization fixing means. The magnetic memory cell 1 is provided with a first magnetic body 61 and a second magnetic body 62 which serve as the magnetization fixing means. The first magnetic body 61 applies a bias magnetic field of the −X direction to the first magnetization fixed region 11. On the other hand, the second magnetic body 62 applies a bias magnetic field of the +X direction to the second magnetization fixed region 12.

More specifically, the first magnetic body 61 includes a ferromagnetic layer having magnetization of the +X direction opposite to the −X direction, and the ferromagnetic layer is formed apart from the first magnetization fixed region 11. The first magnetic body 61 fixes the magnetization direction of the first magnetization fixed region 11 to the −X direction by the "magnetostatic coupling". On the other hand, the second magnetic body 62 includes a ferromagnetic layer having magnetization of the −X direction opposite to the +X direction, and the ferromagnetic layer is formed apart from the second magnetization fixed region 12. The second magnetic body 62 fixes the magnetization direction of the second magnetization fixed region 12 to the +X direction by the magnetostatic coupling. In FIG. 15, the first magnetic body 61 and the second magnetic body 62 are provided above the first magnetization fixed region 11 and the second magnetization fixed region 12, respectively. The first magnetic body 61 and the second magnetic body 62 may be provided below or lateral to the first magnetization fixed region 11 and the second magnetization fixed region 12, respectively.

As shown in FIG. 15, the first magnetic body 61 is a laminated film of CoFe/Ru/CoFe/PtMn, for example. The second magnetic body 62 is a laminated film of CoFe/PtMn, for example. The reason why the first magnetic body 61 and the second magnetic body 62 have different film structures is the same as in the case of the exchange coupling. Also, a similar first magnetic body 61 and a similar second magnetic body 62 can be applied to the "fourth structural example" and the "fifth structural example".

Figure 16:
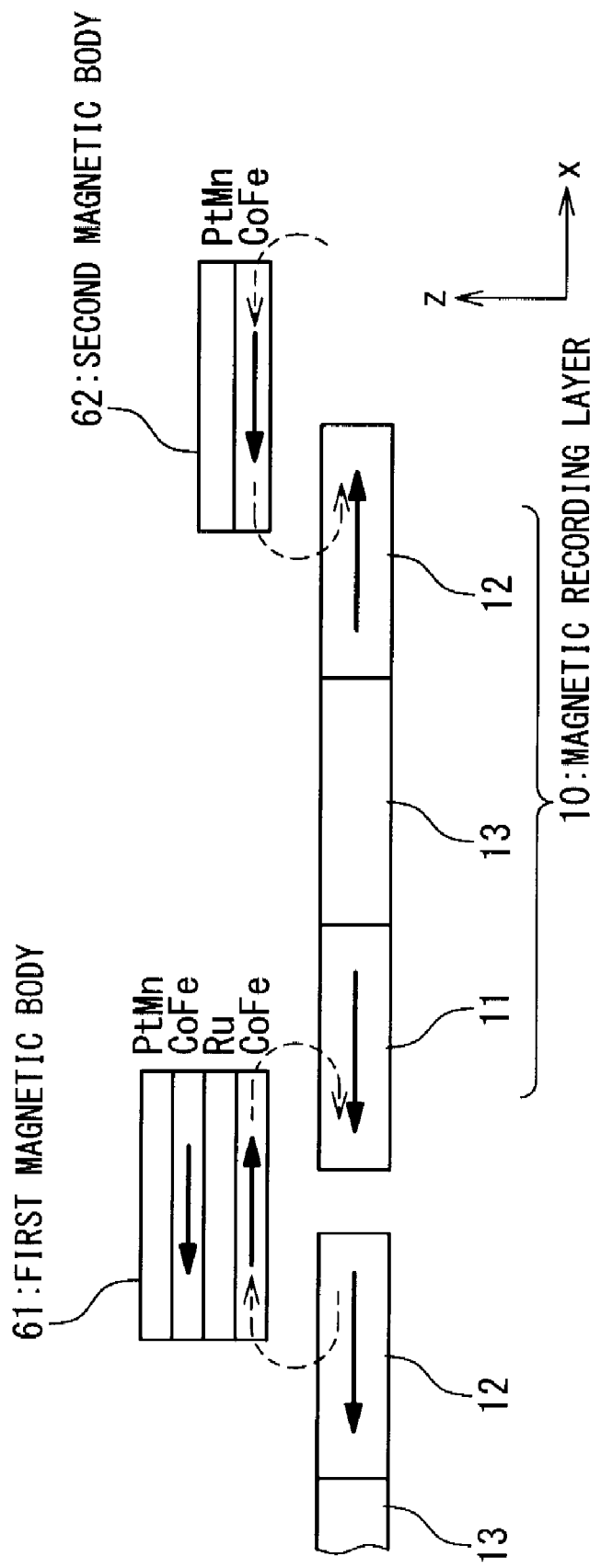
FIG. 16 is a side view showing still another example of a method for fixing magnetization directions in magnetization fixed regions.

FIG. 16 shows a configuration for collectively fixing the magnetizations with respect to two-bits magnetic memory cells. As shown in FIG. 16, for example, the first magnetic body 61 is provided at a position over a gap between the two adjacent magnetic memory cells. The first magnetic body 61 fixes the magnetization direction of the first magnetization fixed region 11 of a magnetic memory cell to the −X direction by the magnetostatic coupling. At the same time, the first magnetic body 61 fixes the magnetization direction of the second magnetization fixed region 12 of the adjacent magnetic memory cell to the −X direction by the magnetostatic coupling. The magnetization direction of the first magnetization fixed region 11 (not shown) of the adjacent magnetic memory cell is fixed to the +X direction by the second magnetic body 62.

Figure 17:
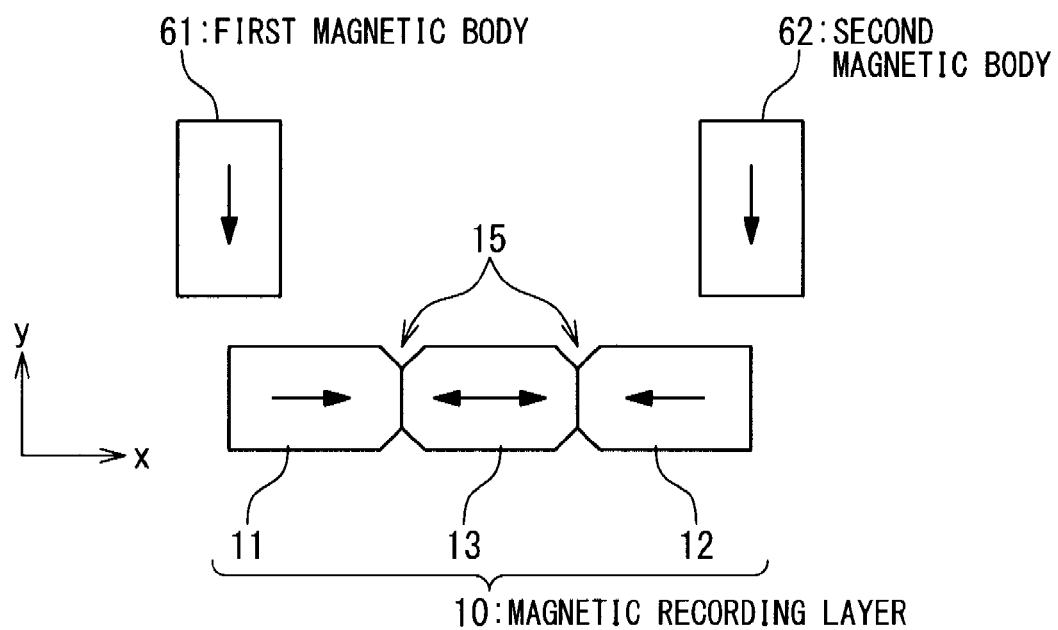
FIG. 17 is a plan view showing still another example of a method for fixing magnetization directions in magnetization fixed regions.
Figure 18:
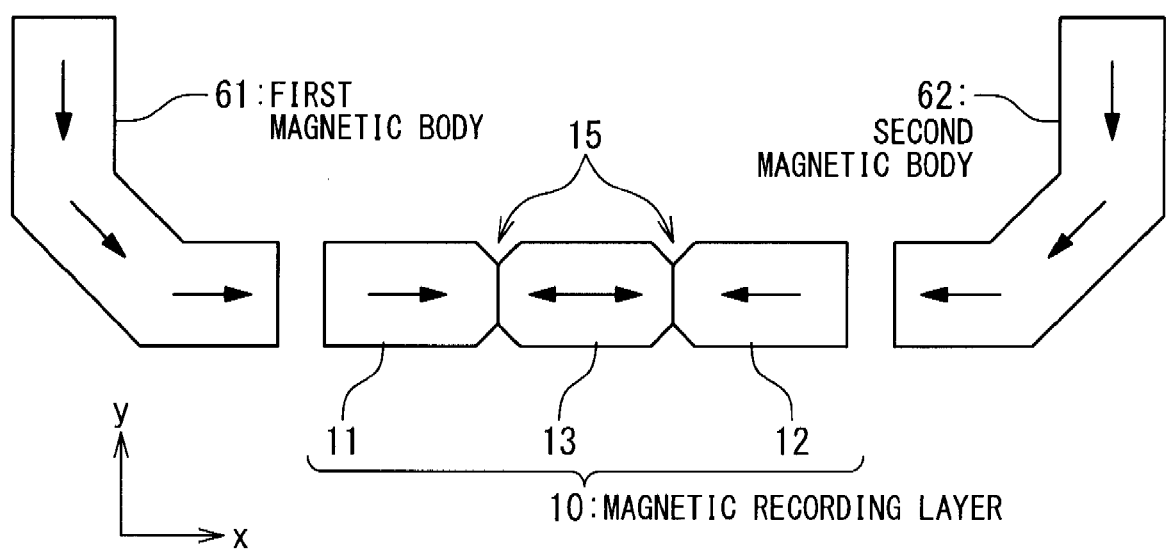
FIG. 18 is a plan view showing still another example of a method for fixing magnetization directions in magnetization fixed regions.

Moreover, as shown in FIGS. 17 and 18, the first magnetic body 61 and the second magnetic body 62 may be provided in the same plane (XY plane) as that of the magnetic recording layer 10. In FIG. 17, the first magnetic body 61 and the second magnetic body 62 are respectively provided near the both ends in the X direction of the magnetic recording layer 10. The magnetizations of the first magnetic body 61 and the second magnetic body 62 are directed to the same direction. Due to such a configuration, the magnetization of the first magnetization fixed region 11 is fixed to the +X direction and the magnetization of the second magnetization fixed region 12 is fixed to the −X direction.

In FIG. 18, the first magnetic body 61 and the second magnetic body 62 are bent and are so formed as to sandwich the magnetic recording layer 10 from both sides. The magnetization direction in an end section of the first magnetic body 61 closest to the first magnetization fixed region 11 is the +X direction. On the other hand, the magnetization direction in an end section of the second magnetic body 62 closest to the second magnetization fixed region 12 is the −X direction. That is to say, the magnetization directions in the end sections are consistent with the magnetization directions to be fixed in the magnetization fixed regions 11 and 12, respectively. Such a configuration makes it easy to achieve the statistic coupling.

It should be noted that the notches 15 may be provided at the boundaries between the magnetization switching region 13 and the magnetization fixed regions 11 and 12, as shown in FIGS. 17 and 18. Alternatively, the magnetic recording layer 10 may have the structures shown in FIGS. 9A to 9C. In this case, the domain wall DW is stabilized. Also, the first magnetic body 61 and the second magnetic body 62 need not be provided in the completely same plane as that of the magnetic recording layer 10 and can be vertically displaced.

The magnetization fixation based on the magnetostatic coupling can also be applied to the first structural example shown in FIG. 3. In this case, the magnetizations of the first magnetization fixed region 11 and the second magnetization fixed region 12 are fixed to the same +Y direction. Therefore, the first magnetic body 61 and the second magnetic body 62 can have the same film structure. For example, the first magnetic body 61 and the second magnetic body 62 are laminated films of CoFe/PtMn.

Figure 19:
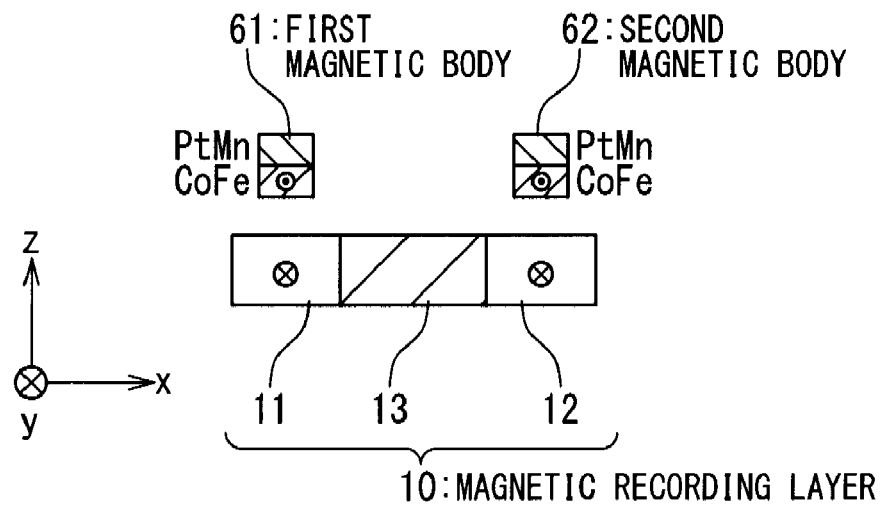
FIG. 19 is a side view showing still another example of a method for fixing magnetization directions in magnetization fixed regions.

Referring to FIG. 19, the first magnetic body 61 and the second magnetic body 62 apply bias magnetic fields of the +Y direction to the first magnetization fixed region 11 and the second magnetization fixed region 12, respectively. More specifically, each of the first magnetic body 61 and the second magnetic body 62 includes a ferromagnetic layer (CoFe layer) having magnetization of the −Y direction opposite to the +Y direction, and the respective ferromagnetic layers are so formed as to be apart from the first magnetization fixed region 11 and the second magnetization fixed region 12. The first magnetic body 61 and the second magnetic body 62 respectively fix the magnetization directions of the first magnetization fixed region 11 and the second magnetization fixed region 12 to the +Y direction by the magnetostatic coupling. Also, a similar first magnetic body 61 and a similar second magnetic body 62 can be applied to the "second structural example" shown in FIG. 5.

(Magnetic Anisotropy)

As to the "first structural example and second structural example" shown in FIGS. 3 to 5, the exchange coupling or the magnetostatic coupling is not necessarily applied to. In FIGS. 3 to 5, longitudinal directions of the first magnetization fixed region 11 and the second magnetization fixed region 12 are the Y direction, while a longitudinal direction of the magnetization switching region 13 is the X direction. Therefore, the first magnetization fixed region 11 and the second magnetization fixed region 12 have magnetic anisotropy of the same direction, while the magnetization switching region 13 has magnetic anisotropy of a direction different from that of the magnetization fixed regions 11 and 12.

Therefore, the magnetization directions of the first magnetization fixed region 11 and the second magnetization fixed region 12 can be set to the +Y direction of the −Y direction in an initial annealing process. The magnetization directions of the first magnetization fixed region 11 and the second magnetization fixed region 12 are maintained to the +Y direction or the −Y direction by the magnetic anisotropy. In this case, the magnetization fixing means such as the first magnetic body 61 and the second magnetic body 62 is not necessary, which is preferable from a viewpoint of decrease in the components. In other words, the "U-shape" shown in FIGS. 3 to 5 is a preferable shape from a viewpoint of the magnetization fixation.

Figure 20:
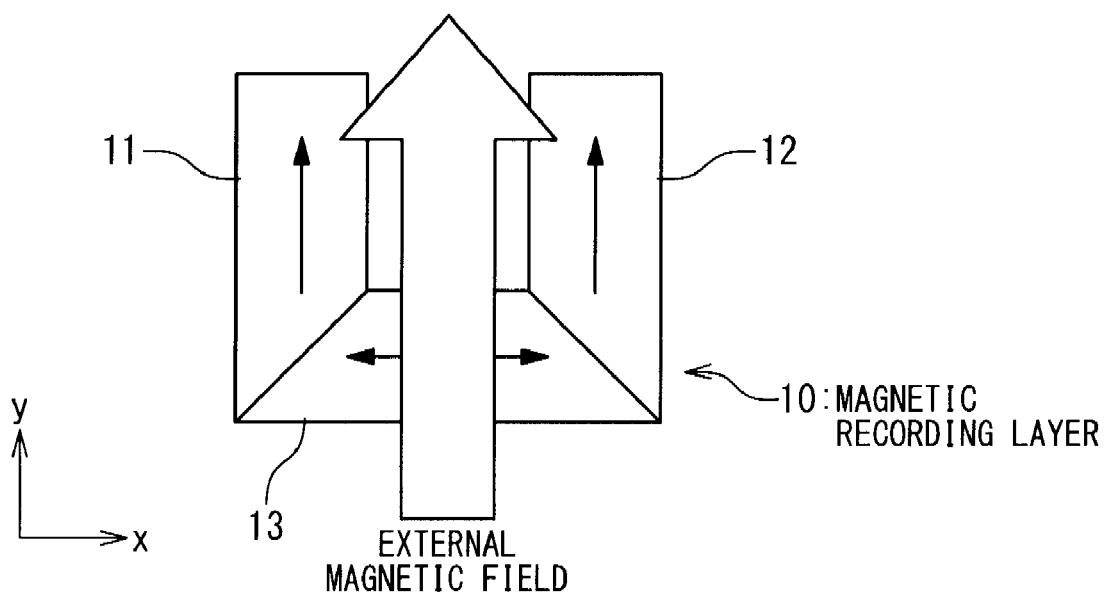
FIG. 20 is a plan view showing still another example of a method for fixing magnetization directions in magnetization fixed regions.

Also, an external magnetic field whose direction is the same as the direction of the fixed magnetization may be uniformly applied to the magnetic memory cell 1, as shown in FIG. 20. For example, a magnet of several Oe is provided on a package. As a result, the magnetization fixation is stabilized and hence thermal stability is improved. Needless to say, the above-described exchange coupling or magnetostatic coupling can be applied in addition. In that case, the magnetization fixation is further stabilized.

1-4. Effects

According to the present invention, as described above, a new data read and write method is proposed with regard to the random-accessible MRAM. The data writing is achieved by the domain wall motion due to the spin transfer within the magnetic recording layer 10. The data reading is achieved by using the MTJ. Resultant effects are as follows.

First, excellent selectivity of the memory cell can be ensured as compared with the asteroid method. In the case of the asteroid method, variation in a threshold value of a write magnetic field deteriorates the memory cell selectivity in a 2-dimensional memory cell array. According to the spin transfer method, however, the write current acts only on a target memory cell. Thus, the disturbance is greatly reduced. In other words, a selective writing property is improved.

Also, a scaling property of the write current is improved as compared with the asteroid method and the toggle method. In the case of the asteroid method and the toggle method, a magnetic switching field necessary for switching the magnetization of the magnetic recording layer increases in substantially inverse proportion to the size of the memory cell. That is to say, the write current tends to increase with the miniaturization of the memory cell. According to the spin transfer method, however, the threshold value of the magnetization switching depends on current density. Since the current density is increased with the reduction of the size of the memory cell, it is possible to reduce the write current with the miniaturization of the memory cell. In other words, it is not necessary to increase the write current when the size of the memory cell is reduced. In that sense, the scaling property of the write current is improved. This is important in realizing a large-capacity MRAM.

Also, a current-magnetic field conversion efficiency is increased as compared with the asteroid method and the toggle method. In the case of the asteroid method and the toggle method, the write current is consumed by Joule heating. It has been necessary to provide a write-dedicated wiring such as a flux keeper and a yoke structure in order to enhance the current-magnetic field conversion efficiency. This causes complexity of the manufacturing process and an increase in wiring inductance. According to the spin transfer method, however, the write current directly contributes to the spin transfer. Therefore, the current-magnetic field conversion efficiency is increased. Consequently, the complexity of the manufacturing process and the increase in the wiring inductance can be prevented.

Moreover, the deterioration of the MTJ (tunnel barrier layer 20) is suppressed as compared with the conventional spin transfer magnetization switching. The conventional spin transfer magnetization switching is achieved by the CPP (Current Perpendicular to Plane) method, where the write current is injected in a direction perpendicular to the film plane. The write current at the time of data writing is much larger than the read current, and there is a possibility that the large current destroys the tunnel barrier layer 20. According to the write method in the present invention, however, a current path at the time of reading and a current path at the time of writing are separated from each other. More specifically, the write currents IW1 and 1W2 do not penetrate through the MTJ but flow within the plane of the magnetic recording layer 10 at the time of data writing. It is not necessary at the time of data writing to inject a large current in a direction perpendicular to the MTJ film plane. Consequently, the deterioration of the tunnel barrier layer 20 in the MTJ can be suppressed.

Furthermore, the write speed is increased with the miniaturization of the memory cell. The reason is that the data writing in the present invention is achieved by the domain wall motion within the magnetic recording layer 10. The reduction of the memory cell size means that a moving distance of the domain wall DW becomes shorter. Therefore, the write speed is increased with the reduction of the memory cell size.

According to the present invention, the above-described effects can be simultaneously obtained. The technique according to the present invention is extremely useful in order to realize a high-integration, high-speed operation and low power consumption MRAM.

2. Second Exemplary Embodiment

Figure 21:
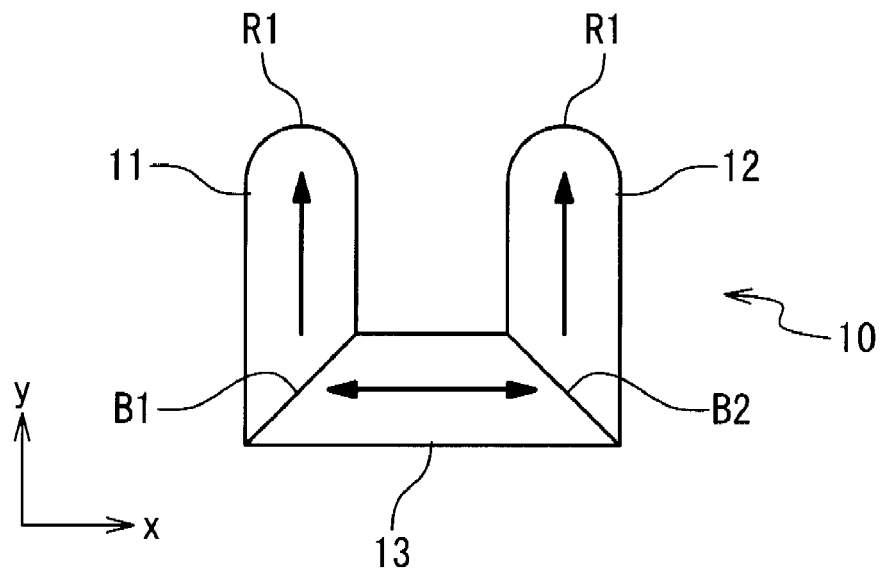
FIG. 21 is a plan view showing a structural example of a magnetic memory cell according to a second exemplary embodiment of the present invention.
Figure 22:
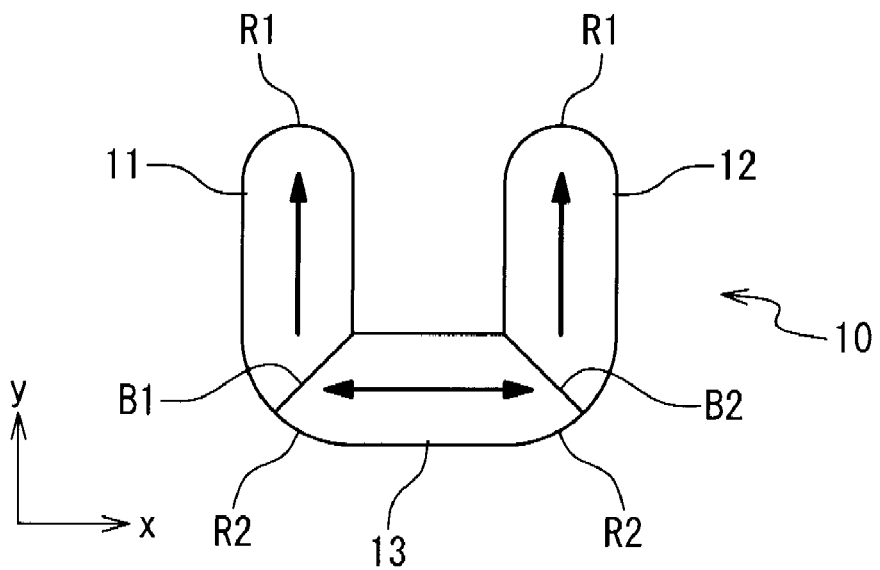
FIG. 22 is a plan view showing another structural example of a magnetic memory cell according to the second exemplary embodiment.
Figure 23:
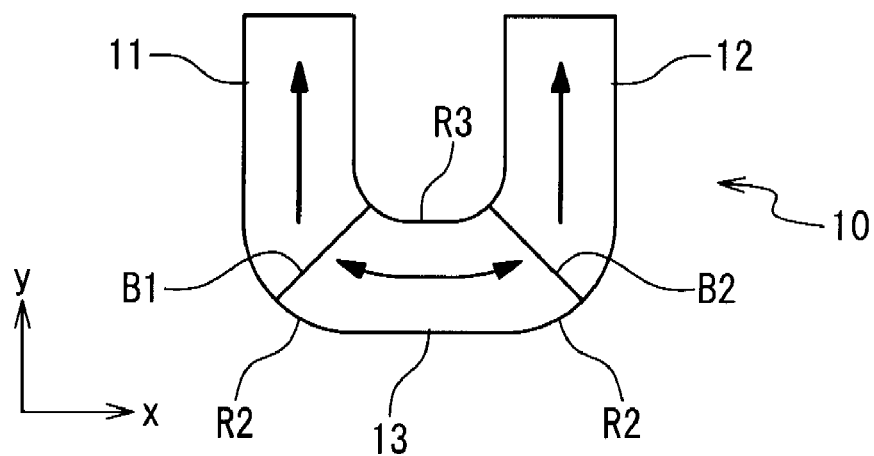
FIG. 23 is a plan view showing still another structural example of a magnetic memory cell according to the second exemplary embodiment.
Figure 24:
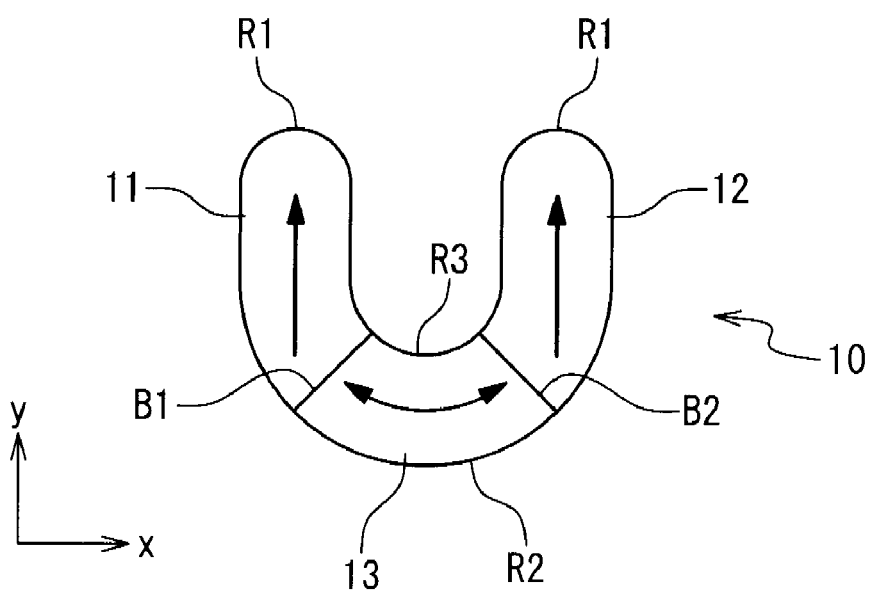
FIG. 24 is a plan view showing still another structural example of a magnetic memory cell according to the second exemplary embodiment.

Still other patterns can be considered as a shape of the magnetic recording layer 10. FIGS. 21 to 24 are plan views showing various patterns of the shape of the magnetic recording layer 10. An end portion or a corner portion of the magnetic recording layer 10 may have a round shape instead of a sharp shape. In FIG. 21, for example, an end portion R1 opposed to the first boundary B1 of the first magnetization fixed region 11 is rounded. An end portion R1 opposed to the second boundary B2 of the second magnetization fixed region 12 is rounded. In FIG. 22, an outer corner portion R2 associated with the position of the first boundary B1 and an outer corner portion R2 associated with the position of the second boundary B2 are also rounded in addition to the end portions R1. In FIG. 23, inner corner portions R3 as well as the outer corner portions R2 are rounded. In FIG. 24, all the end portions and the corner portions are rounded. Moreover, the magnetization switching region 13 shown in FIG. 24 does not have a linear section and is gently curved as a whole. The same effects as in the first exemplary embodiment can also be obtained by these shapes. The magnetization switching region 13 just needs to be formed so as to connect between the first magnetization fixed region 11 and the second magnetization fixed region 12.

3. Third Exemplary Embodiment

Figure 25:
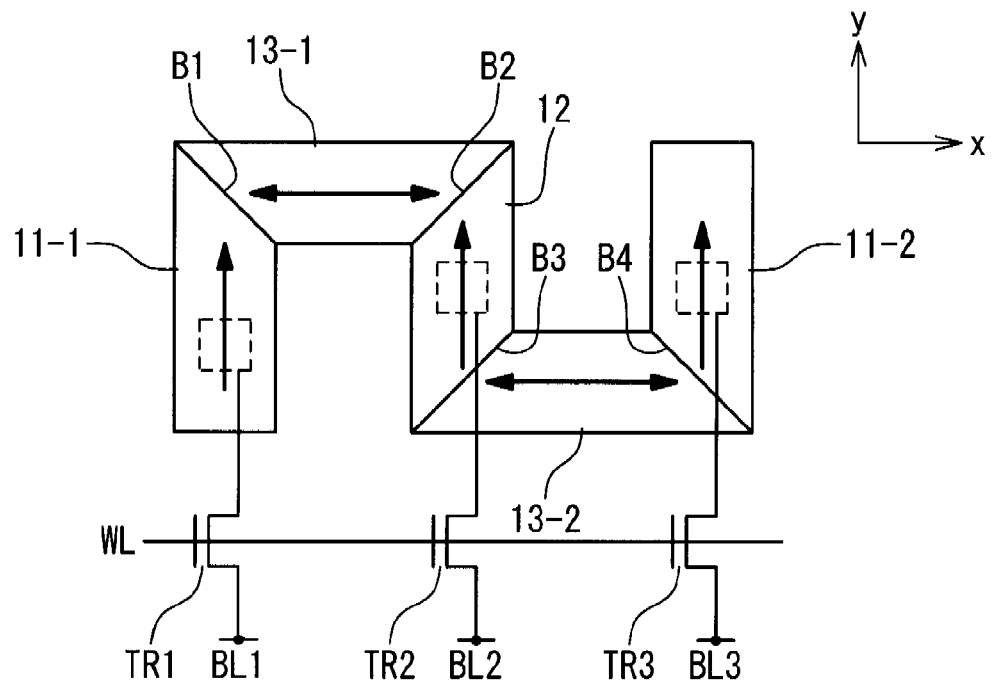
FIG. 25 is a plan view showing a structural example of a magnetic memory cell according to a third exemplary embodiment of the present invention.
Figure 26:
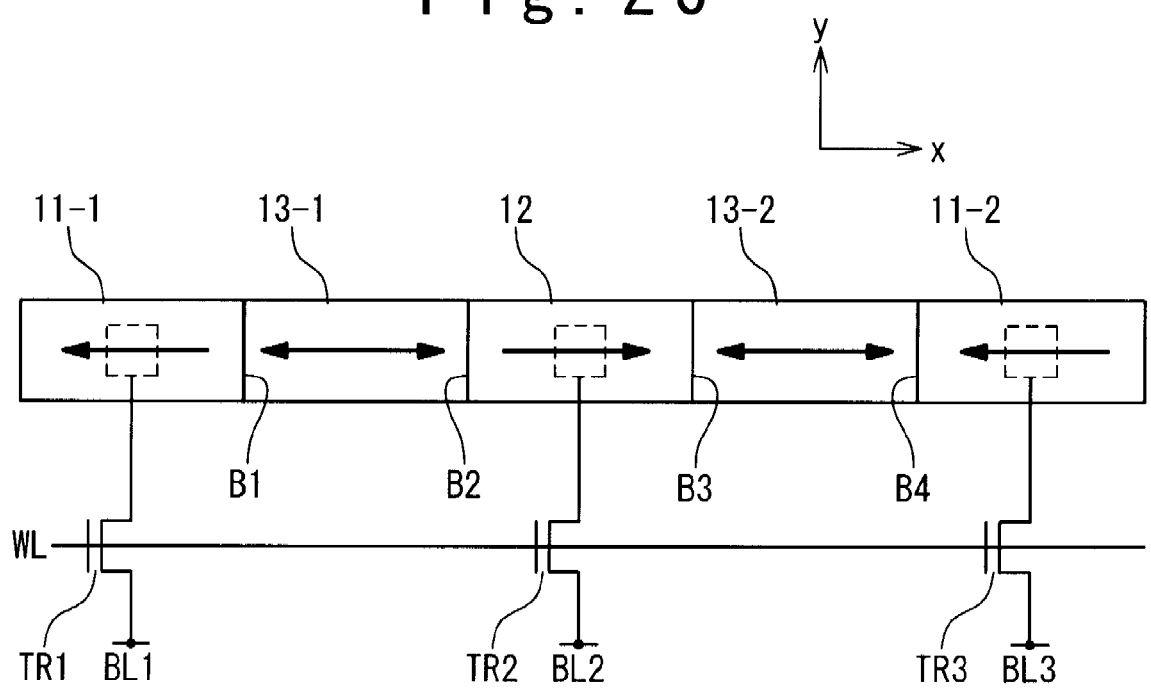
FIG. 26 is a plan view showing another structural example of a magnetic memory cell according to the third exemplary embodiment.

FIGS. 25 and 26 are plan views showing still other structural examples of the magnetic memory cell. In FIGS. 25 and 26, 2-bit memory cells have a continuous structure. The magnetic recording layer 10 includes a first magnetization fixed region 11-1, a first magnetization fixed region 13-1, a second magnetization fixed region 12, a second magnetization switching region 13-2 and a third magnetization fixed region 11-2. The first magnetization switching region 13-1 and the second magnetization switching region 13-2 are connected to pinned layers (not shown) through tunnel barrier layers, respectively.

The first magnetization fixed region 11-1 and the first magnetization switching region 13-1 are connected to each other at a first boundary B1, and the first magnetization switching region 13-1 and the second magnetization fixed region 12 are connected to each other at a second boundary B2. The first boundary B1 and the second boundary B2 are located at respective ends of the first magnetization switching region 13-1. Also, the second magnetization fixed region 12 and the second magnetization switching region 13-2 are connected to each other at a third boundary B3, and the second magnetization switching region 13-2 and the third magnetization fixed region 11-2 are connected to each other at a fourth boundary B4. The third boundary B3 and the fourth boundary B4 are located at respective ends of the second magnetization switching region 13-2.

In FIG. 25, the first magnetization fixed region 11-1, the second magnetization fixed region 12 and the third magnetization fixed region 11-2 are so formed along the Y direction as to be substantially parallel to each other. The first magnetization switching region 13-1 is so formed along the X direction as to connect between the first magnetization fixed region 11-1 and the second magnetization fixed region 12. The second magnetization switching region 13-2 is so formed along the X direction as to connect between the second magnetization fixed region 12 and the third magnetization fixed region 11-2.

The magnetizations of the first magnetization switching region 13-1 and the second magnetization switching region 13-2 are reversible and allowed to be directed to either the +X direction or the −X direction. The magnetization directions of the first magnetization fixed region 11-1, the second magnetization fixed region 12 and the third magnetization fixed region 11-2 are fixed to the +Y direction. In this case, the magnetizations of the first magnetization fixed region 11-1 and the second magnetization fixed region 12 are both fixed to directions toward the first magnetization switching region 13-1. Also, the magnetizations of the second magnetization fixed region 12 and the third magnetization fixed region 11-2 are both fixed to directions away from the second magnetization switching region 13-2. That is to say, the magnetization of the first magnetization fixed region 11-1, the magnetization of the second magnetization fixed region 12 and the magnetization of the third magnetization fixed region 11-2 are reversed alternately along the shape of the magnetic recording layer 10.

In FIG. 26, the first magnetization fixed region 11-1, the second magnetization fixed region 12 and the third magnetization fixed region 11-2 are so formed along the X direction as to be substantially parallel to each other. The first magnetization switching region 13-1 is so formed along the X direction as to connect between the first magnetization fixed region 11-1 and the second magnetization fixed region 12. The second magnetization switching region 13-2 is so formed along the X direction as to connect between the second magnetization fixed region 12 and the third magnetization fixed region 11-2. That is to say, the first magnetization fixed region 11-1, the first magnetization switching region 13-1, the second magnetization fixed region 12, the second magnetization switching region 13-2 and the third magnetization fixed region 11-2 are linearly formed along the X direction.

The magnetizations of the first magnetization switching region 13-1 and the second magnetization switching region 13-2 are reversible and allowed to be directed to either the +X direction or the −X direction. The magnetization directions of the first magnetization fixed region 11-1 and the third magnetization fixed region 11-2 are fixed to the −X direction, while the magnetization direction of the second magnetization fixed region 12 is fixed to the +X direction. In this case, the magnetizations of the first magnetization fixed region 11-1 and the second magnetization fixed region 12 are both fixed to directions away from the first magnetization switching region 13-1. Also, the magnetizations of the second magnetization fixed region 12 and the third magnetization fixed region 11-2 are both fixed to directions toward the second magnetization switching region 13-2. That is to say, the magnetization of the first magnetization fixed region 11-1, the magnetization of the second magnetization fixed region 12 and the magnetization of the third magnetization fixed region 11-2 are reversed alternately along the shape of the magnetic recording layer 10.

In FIGS. 25 and 26, the first magnetization fixed region 11-1 is connected to a first bit line BL1 through a first transistor TR1. The second magnetization fixed region 12 is connected to a second bit line BL2 through a second transistor TR2. The third magnetization fixed region 11-2 is connected to a third bit line BL3 through a third transistor TR3. When a data is written to the first magnetization switching region 13-1, for example, the first transistor TR1 and the second transistor TR2 are turned ON and a write current whose direction is dependent on the write data is supplied to the first bit line BL1 and the second bit line BL2. Also, when a data is written to the second magnetization switching region 13-2, the second transistor TR2 and the third transistor TR3 are turned ON and a write current whose direction is dependent on the write data is supplied to the second bit line BL2 and the third bit line BL3. The data reading can be realized by a cross-point method, for example. The same effects as in the first exemplary embodiment can also be obtained by these structures.

The generalization of a structure including continuous n-bit memory cells (n is a natural number) gives the following expression. The magnetic recording layer includes n magnetization switching regions $A_1$ to $A_n$ and n+1 magnetization fixed regions $B_1$ to $B_{n+1}$. The n magnetization switching regions $A_1$ to $A_n$ and the n+1 magnetization fixed regions $B_1$ to $B_{n+1}$ are arranged alternately. That is to say, the i-th magnetization switching region $A_i$ (i is an integer not less than 1 and not more than n) is so formed as to connect between the i-th magnetization fixed region $B_i$ and the (i+1)-th magnetization fixed region $B_{i+1}$. The magnetization of the i-th magnetization fixed region $B_i$ and the magnetization of the (i+1)-th magnetization fixed region $B_{i+1}$ are fixed to directions toward or away from the i-th magnetization switching region $A_i$. The magnetizations of adjacent magnetization fixed regions are fixed to the opposite directions. That is, the magnetizations of the n+1 magnetization fixed regions $B_1$ to $B_{n+1}$ are reversed alternately along the shape of the magnetic recording layer. Also, n MTJs are formed with respect to the n magnetization switching regions $A_1$ to $A_n$, respectively. Moreover, the n+1 magnetization fixed regions $B_1$ to $B_{n+1}$ are connected to n+1 bit lines $BL_1$ to $BL_{n+1}$ through n+1 transistors, respectively. When a data is written to the i-th magnetization switching region $A_i$, a write current whose direction is dependent on the write data is supplied to the i-th bit line $BL_i$ and the (i+1)-th bit line $BL_{i+1}$.

4. Fourth Exemplary Embodiment

Figure 27:
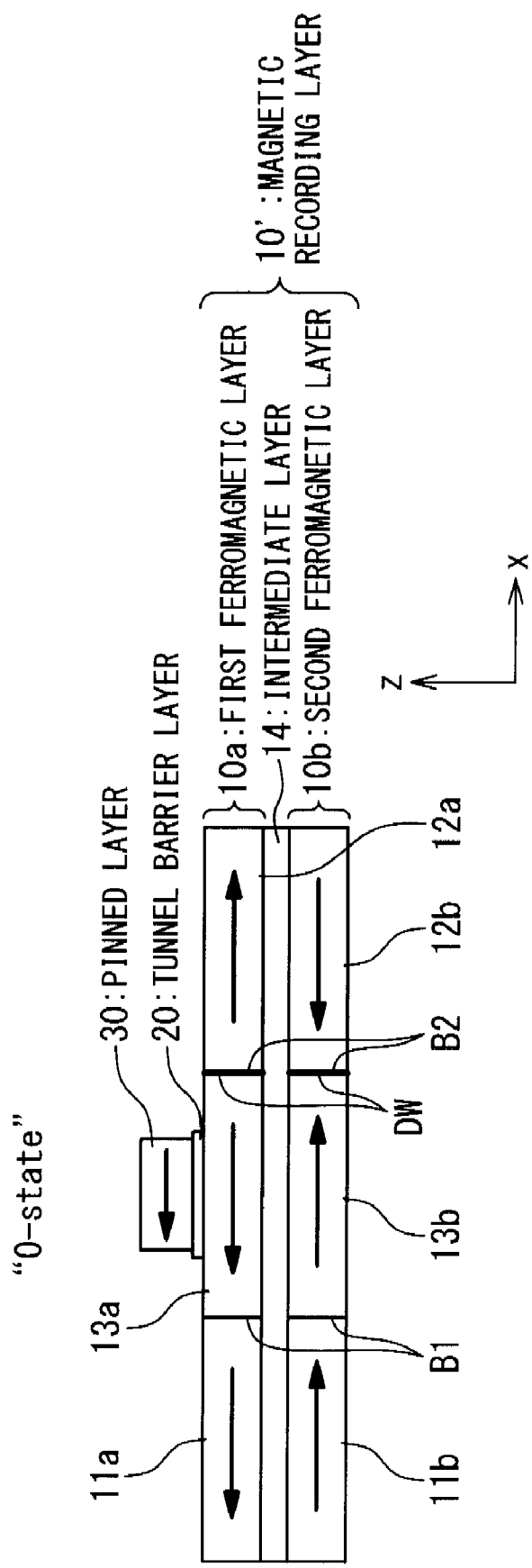
FIG. 27 is a side view showing a structural example of a magnetic memory cell according to a fourth exemplary embodiment of the present invention.

FIG. 27 is a side view showing a structural example of the magnetic memory cell according to a fourth exemplary embodiment. In the present exemplary embodiment, a magnetic recording layer 10' is constituted by an SAF (Synthetic Anti-Ferromagnetic) layer. More specifically, the magnetic recording layer 10' includes a first ferromagnetic layer 10a and a second ferromagnetic layer 10b which are anti-ferromagnetically coupled through an intermediate layer 14. The intermediate layer is a non-magnetic layer, e.g. a Ru layer. The first ferromagnetic layer 10a includes the first magnetization fixed region 11a, the second magnetization fixed region 12a and the magnetization fixed region 13a sandwiched between the first and second magnetization fixed regions 11a and 12a. Also, the second ferromagnetic layer 10b includes the first magnetization fixed region 11b, the second magnetization fixed region 12b and the magnetization fixed region 13b sandwiched between the first and second magnetization fixed regions 11b and 12b.

The magnetization directions of the first magnetization fixed regions 11a and 11b are opposite to each other. The magnetization directions of the second magnetization fixed regions 12a and 12b are opposite to each other. The magnetization directions of the magnetization switching regions 13a and 13b are opposite to each other. The magnetizations of the magnetization switching regions 13a and 13b are reversible and directed to either the +X direction or the −X direction. When the magnetization of one of the magnetization switching regions 13a and 13b is reversed, the magnetization of the other is also reversed. The magnetization switching region 13a of the first ferromagnetic layer 10a is adjacent to the pinned layer 30 through the tunnel barrier layer 20. Shown in FIG. 27 is the "0 state" in which the magnetization of the magnetization switching region 13a and the magnetization of the pinned layer 30 are parallel to each other. In this case, the domain wall DW exists at the second boundary B2.

The data writing is performed in the same manner as in the foregoing exemplary embodiments. At the time of writing data "1", for example, a write current is flowed from the first magnetization fixed regions 11a and 11b to the second magnetization fixed regions 12a and 12b in the magnetic recording layer 10'. As a result, both the magnetizations of the magnetization switching regions 13a and 13b are reversed and the domain wall DW moves to the first boundary B1. The data reading is performed by sensing the magnetization direction of the magnetization switching region 13a of the first ferromagnetic layer 10a with the use of the pinned layer 30. The same effects as in the first exemplary embodiment can also be obtained by such a structure. Furthermore, it is expected that an influence of an external magnetic field is reduced due to the SAF layer.

5. Fifth Exemplary Embodiment

Figure 28A:
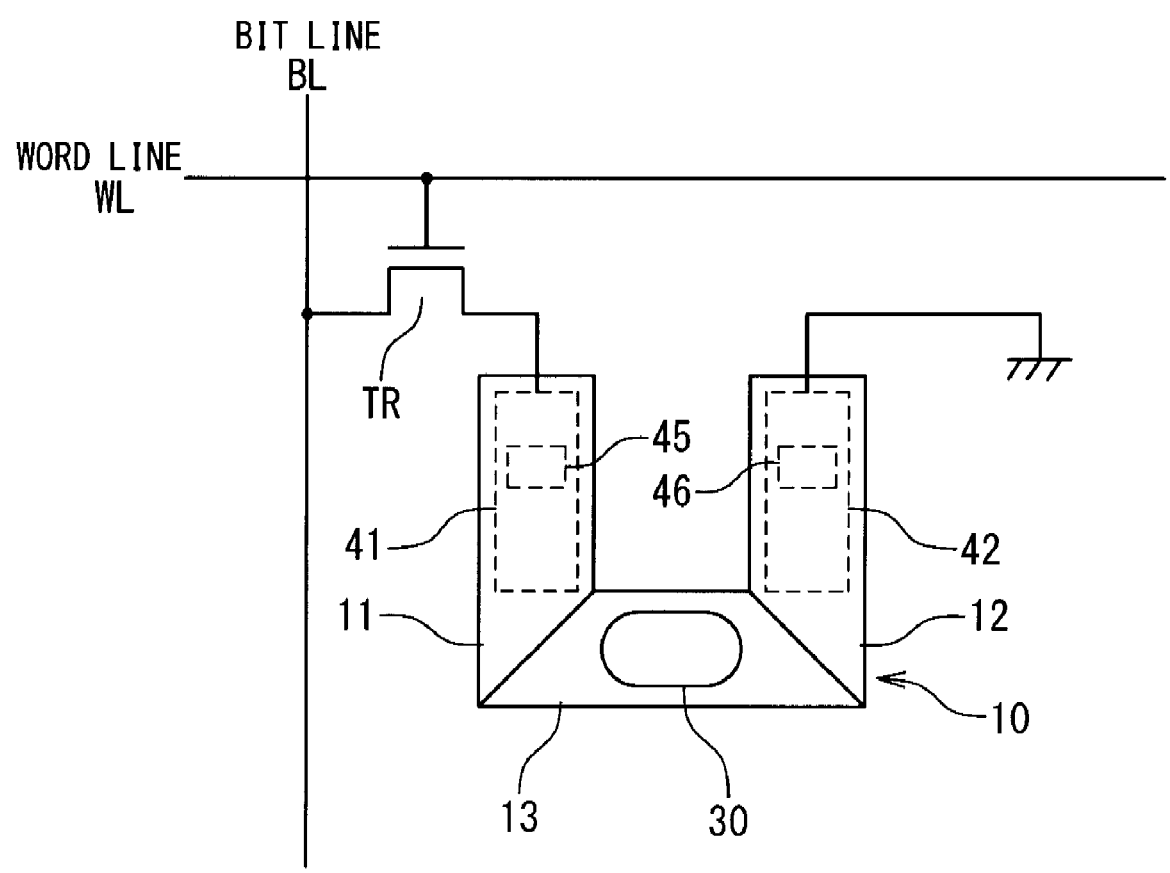
FIG. 28A is a plan view schematically showing a circuit configuration of a magnetic memory cell according to a fifth exemplary embodiment of the present invention.
Figure 28B:
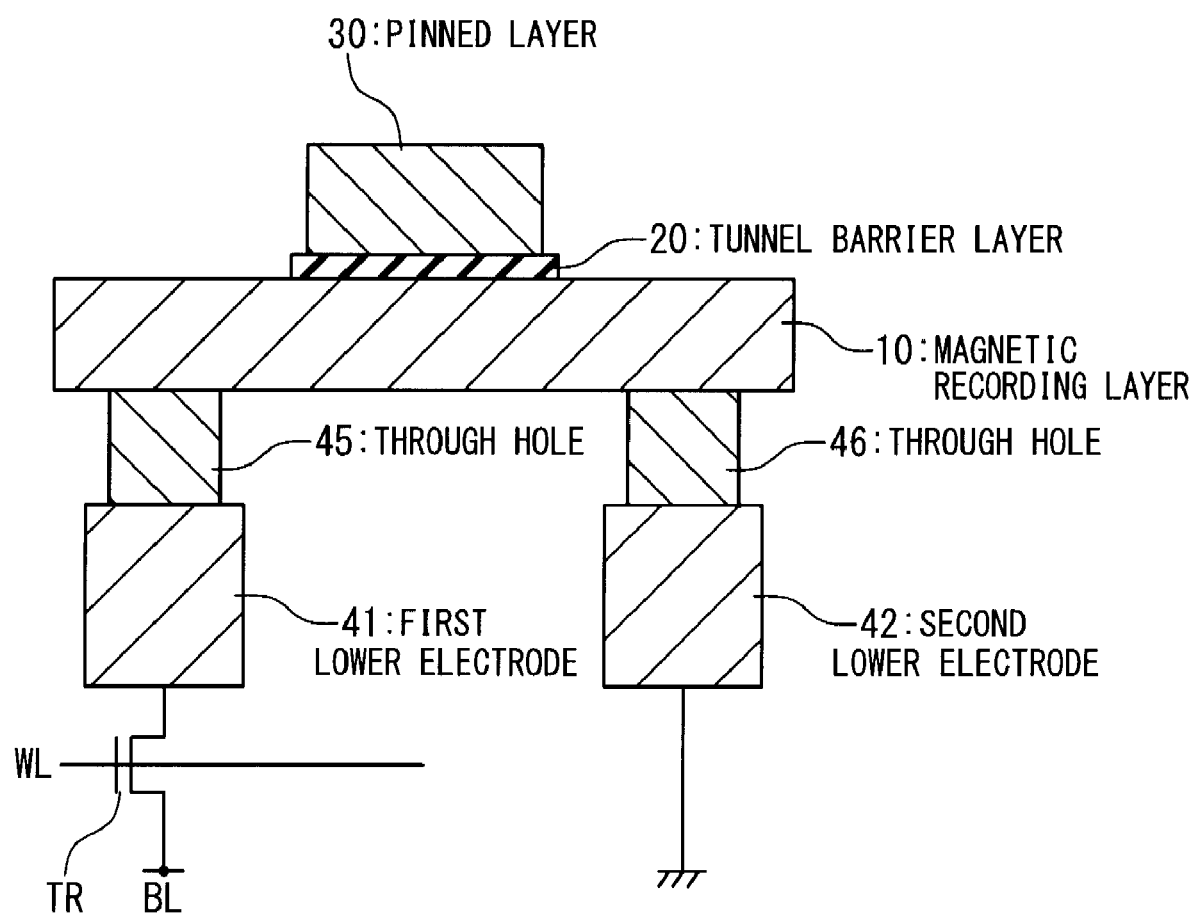
FIG. 28B is a cross-sectional view schematically showing a circuit configuration of the magnetic memory cell according to the fifth exemplary embodiment.

Although a circuit configuration of the magnetic memory cell which has the two transistors TR1 and TR2 is shown in FIGS. 10A and 10B, a circuit configuration is not limited thereto. FIG. 28A is a plan view showing a circuit configuration of the magnetic memory cell which has only one transistor TR. Also, FIG. 28B is a cross-sectional view schematically showing a structure of the magnetic memory cell shown in FIG. 28A.

The first magnetization fixed region 11 of the magnetic recording layer 10 is connected to the first lower electrode 41 via the through hall 45, while the second magnetization fixed region 12 is connected to the second lower electrode 42 via the through hall 46. The first lower electrode 41 is connected to one of source/drain of the transistor TR, and the other of the source/drain of the transistor TR is connected to a bit line BL. Also, the second lower electrode 42 is connected to the ground. A gate of the transistor TR is connected to the word line WL.

At the time of data writing, a word line WL connected to a target memory cell is selected, and the transistor TR of the target memory cell is turned ON. The direction of the write current flowed in the bit line BL is changed depending on the write data. At the time of writing data "1", for example, the write current supply circuit supplies the first write current IW1 to the bit line BL. In this case, the first write current IW1 flows from the bit line BL into the ground through the transistor TR, the first magnetization fixed region 11, the magnetization switching region 13 and the second magnetization fixed region 12. On the other hand, at the time of writing data "0", the write current supply circuit draws the second write current IW2 from the ground. In this case, the second write current IW2 flows from the ground into the bit line BL through the second magnetization fixed region 12, the magnetization switching region 13, the first magnetization fixed region 11 and the transistor TR. The data reading can be realized by a cross-point method, for example. The same effects as in the first exemplary embodiment can also be obtained by such a structure.

6. Sixth Exemplary Embodiment

Figure 29:
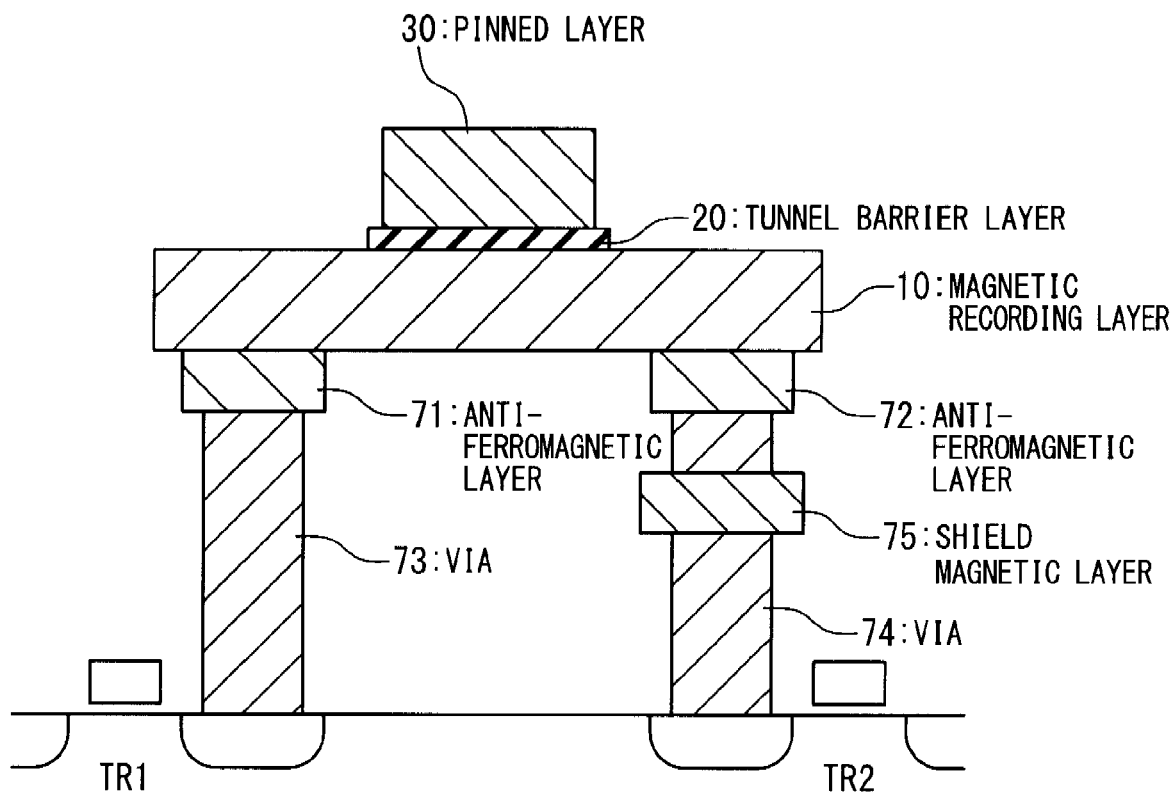
FIG. 29 is a cross-sectional view schematically showing a structural example of a magnetic memory cell according to a sixth exemplary embodiment of the present invention.

FIG. 29 shows a structural example of a magnetic memory cell according to a sixth exemplary embodiment of the present invention. In FIG. 29, let us consider a case where the magnetic recording layer 10 has a linear shape (refer to the third, fourth and fifth structural examples). The tunnel barrier layer 20 and the pinned layer 30 are stacked on the magnetic recording layer 10. Moreover, anti-ferromagnetic layers 71 and 72 are attached to the lower portions of the first magnetization fixed region 11 and the second magnetization fixed region 12 of the magnetic recording layer 10, respectively. The anti-ferromagnetic layers 71 and 72 are connected to source/drain diffusion layers of the first transistor TR1 and the second transistor TR2 through vias 73 and 74, respectively. Also, a shield magnetic layer 75 made of soft magnetic material is provided at the middle of the via 74. The shield magnetic layer 75 has an effect of shielding a magnetic field with respect to a side of the anti-ferromagnetic layer 72.

Figure 30:
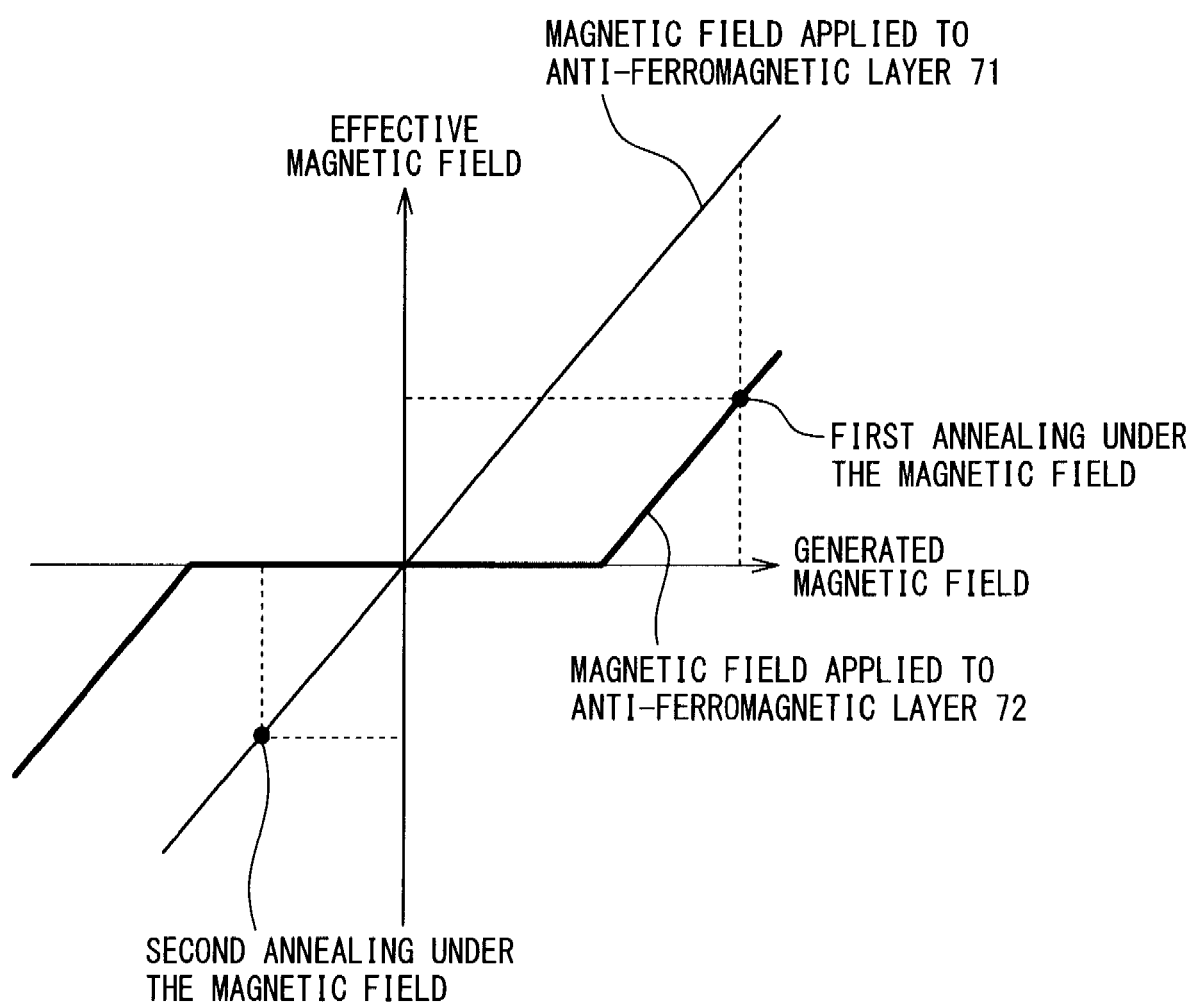
FIG. 30 is a diagram for explaining a method of manufacturing the magnetic memory cell according to the sixth exemplary embodiment.

With regard to the structure shown in FIG. 29, a method of fixing the magnetization directions of the magnetization fixed regions 11 and 12 to the opposite directions is as follows. Referring to FIG. 30, a first annealing process is first performed under a magnetic field that is strong enough to exceed the shield effect by the shield magnetic layer 75. As a result, both of the anti-ferromagnetic layers 71 and 72 hold the magnetizations of the same first direction. Next, a second annealing process is performed under a magnetic field that does not exceed the shield effect by the shield magnetic layer 75. The direction of the second magnetic filed is set opposite to the direction of the first magnetic field. As a result, the magnetization direction of the anti-ferromagnetic layer 72 is maintained, while the magnetization direction of the anti-ferromagnetic layer 72 is changed to the second direction opposite to the first direction.

As described above, it is possible to fix the magnetization directions of the magnetization fixed regions 11 and 12 to the opposite directions by performing the annealing process twice with the use of the shield magnetic layer 75. According to the present exemplary embodiment, it is possible to fix the magnetizations of the magnetization fixed regions 11 and 12 with such a simple structure and by such an easy process. Accordingly, the area of the magnetic memory cell and the manufacturing cost can be reduced.

7. Seventh Exemplary Embodiment

Figure 31:
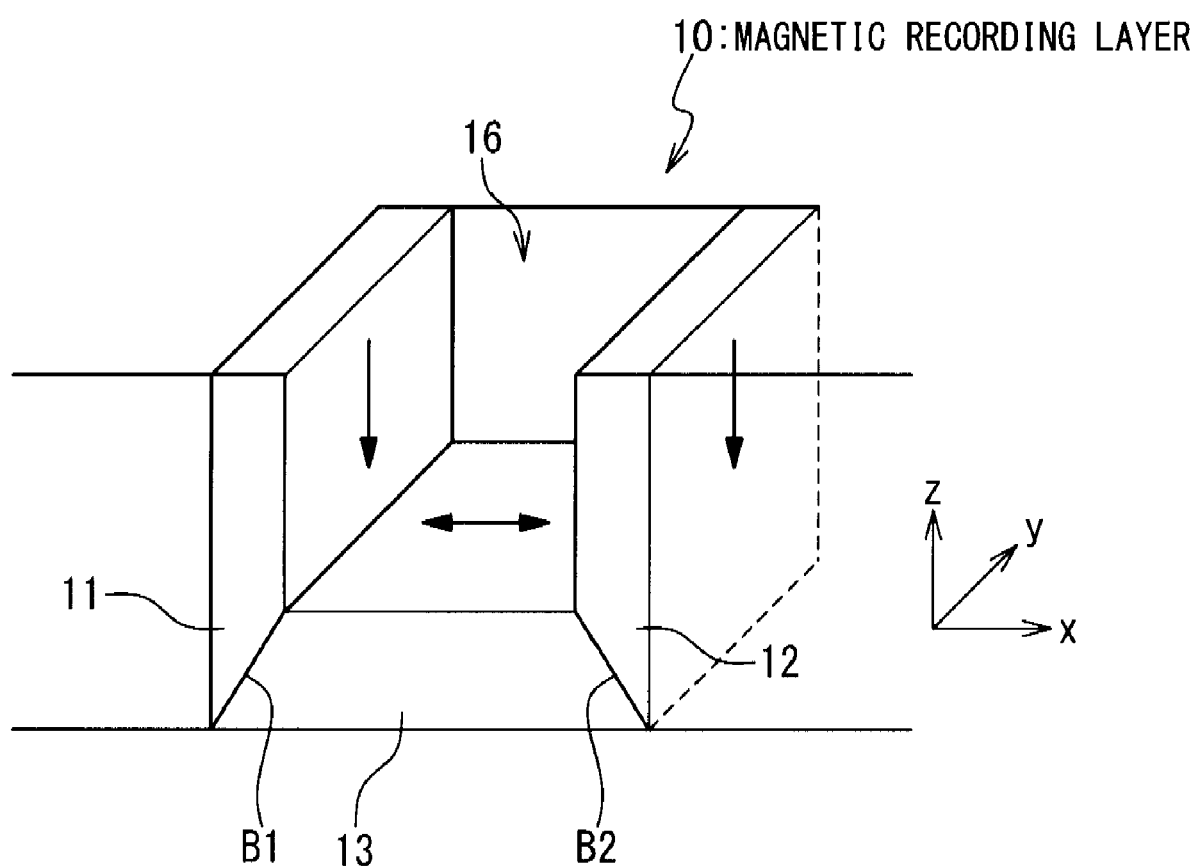
FIG. 31 is an overhead view showing a structural example of a magnetic recording layer according to a seventh exemplary embodiment of the present invention.

In a seventh exemplary embodiment of the present invention, another example of the magnetic recording layer 10 having a U-shape is provided. According to the present exemplary embodiment, the U-shaped magnetic recording layer 10 is sterically formed. More specifically, as shown in FIG. 31, the magnetization switching region 13 is formed parallel to the XY plane, while the magnetization fixed regions 11 and 12 are formed parallel to the YZ plane. In other words, the magnetization fixed regions 11 and 12 are formed to be perpendicular to the XY plane. The magnetization directions of the magnetization fixed regions 11 and 12 are both fixed to either the +Z direction or the −Z direction.

The structure shown in FIG. 31 may be formed within a trench section 16, for example. First, the trench section 16 is formed in a certain layer by using the photolithography technique. Next, a film as a material of the magnetic recording layer 10 is formed on the entire surface. After that, the surface is polished by a CMP (Chemical Mechanical Polishing). The magnetization fixation can be achieved by any of the above-described methods. As a result, the magnetization switching region 13 is formed on a bottom surface of the trench section 16, while the magnetization fixed regions 11 and 12 are respectively formed on opposed side surfaces of the trench section 16. Since the magnetic recording layer 10 is sterically formed, the area of the magnetic memory cell can be reduced.

Figure 32:
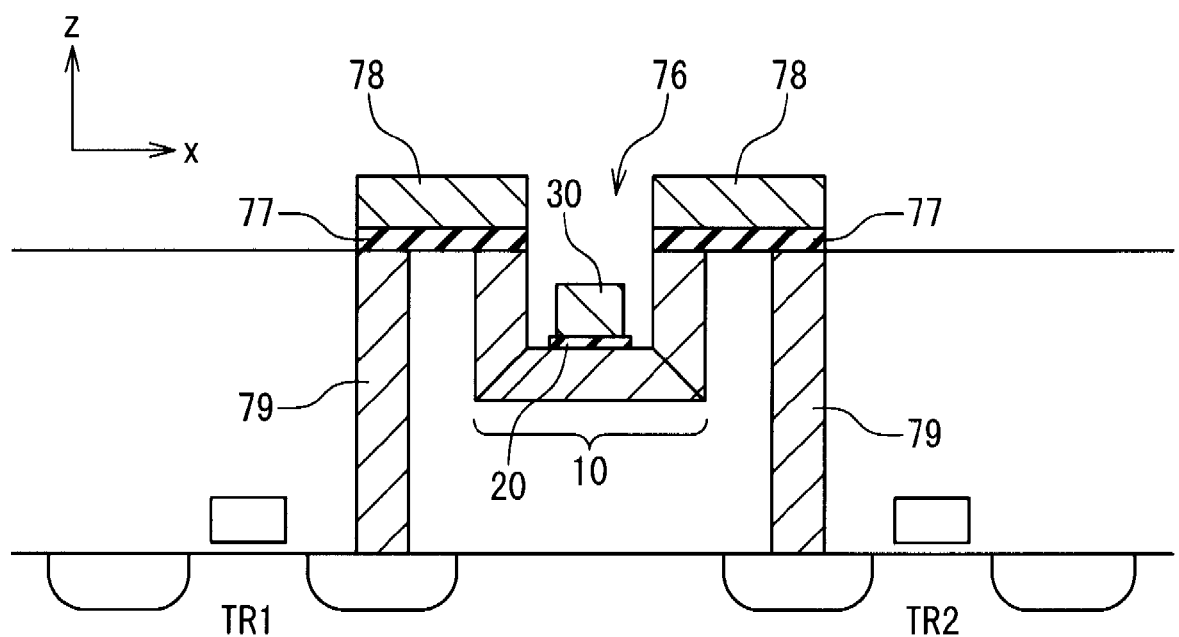
FIG. 32 is a cross-sectional view schematically showing a structural example of a magnetic memory cell according to the seventh exemplary embodiment.

FIG. 32 shows an example of the cross-sectional structure of the magnetic memory cell according to the present exemplary embodiment. The magnetic recording layer 10 is formed within a trench section 76. The tunnel barrier layer 20 and the pinned layer 30 are stacked on the magnetic recording layer 10. Moreover, anti-ferromagnetic layers 77 are formed on the top sections of the magnetization fixed regions 11 and 12 of the magnetic recording layer 10, respectively. Wirings 78 are formed on the anti-ferromagnetic layers 77. Also, the wirings 78 are connected to the source/drain diffusion layers of the first transistor TR1 and the second transistor TR2 through the anti-ferromagnetic layer 77 and via 79.

8. Eighth Exemplary Embodiment

Figure 33:
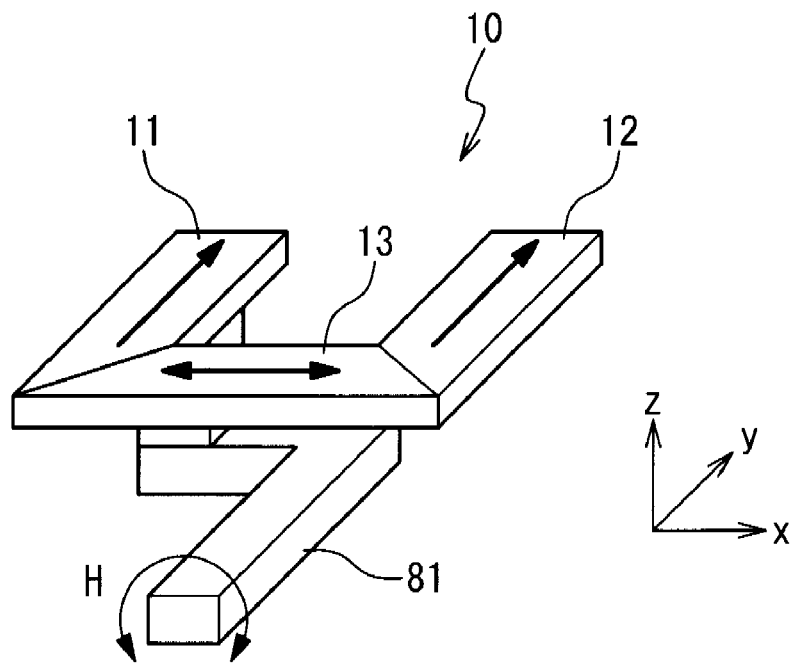
FIG. 33 is an overhead view showing an example of a magnetic memory cell according to an eighth exemplary embodiment of the present invention.
Figure 34:
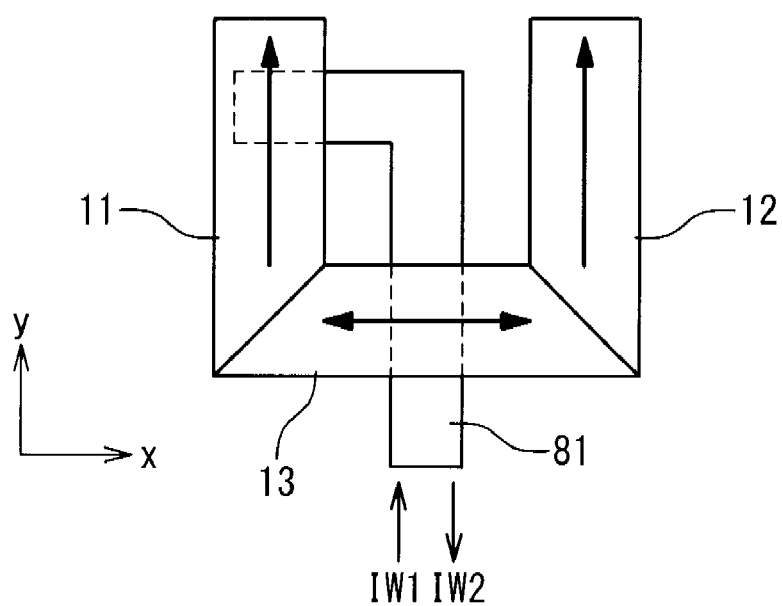
FIG. 34 is a plan view showing the magnetic memory cell shown in FIG. 33.

The magnetization switching (domain wall motion) in the magnetization switching region 13 can be assisted by a magnetic field applied from the outside. For example, FIG. 33 shows an example of a structure in which an assist wiring 81 for assisting the domain wall motion is provided. FIG. 34 is a plan view of the structure shown in FIG. 33. In FIGS. 33 and 34, the assist wiring 81 is so provided below the magnetization switching region 13 as to intersect with near the central portion of the magnetization switching region 13. Furthermore, the assist wiring 81 is connected to the first magnetization fixed region 11. In the write operation, the write currents IW1 and IW2 are supplied to or drawn from the magnetic recording layer 10 through the assist wiring 81.

The structure of the magnetic recording layer 10 in FIGS. 33 and 34 is the same as the first structural example shown in FIG. 4. Referring to FIG. 4 and FIG. 34, the first write current IW1 in the first write operation is introduced from the assist wiring 81 to the first magnetization fixed region 11 and flows toward the second magnetization fixed region 12. At this time, a direction of an assist magnetic field H applied to the magnetization switching region 13 due to the first write current IW1 flowing through the assist wiring 81 is the X direction. That is to say, the assist magnetic field H assists the magnetization switching. On the other hand, the second write current IW2 in the second write operation flows from the second magnetization fixed region 12 to the first magnetization fixed region and flows into the assist current 81. At this time, a direction of an assist magnetic field H applied to the magnetization switching region 13 due to the second write current IW2 flowing through assist wiring 81 is the −X direction. That is to say, the assist magnetic field H assists the magnetization switching. It is also possible that the assist wiring 81 intersects with the magnetization switching region 13 above the magnetization switching region 13 and is connected to the second magnetization fixed region 12. The same effect can be obtained even in that case.

Also, in the case of the second structural example shown in FIG. 5, the assist wiring 81 may intersect with the magnetization switching region 13 below the magnetization switching region 13 and is connected to the second magnetization fixed region 12. Alternatively, the assist wiring 81 may intersect with the magnetization switching region 13 above the magnetization switching region 13 and is connected to the first magnetization fixed region 11. Moreover, the same applies to the cases of the third structural example, the forth structural example and the fifth structural example. The assist wiring 81 is provided above or below the magnetization switching region 13 and connected to the first magnetization fixed region 11 or the second magnetization fixed region 12, depending on the structure. The point is that the assist wiring 81 intersects with the magnetization switching region 13 and is designed such that the assist magnetic field H assists the magnetization switching. Consequently, it is possible to reduce the first write current IW1 and the second write current IW2.

Figure 35:
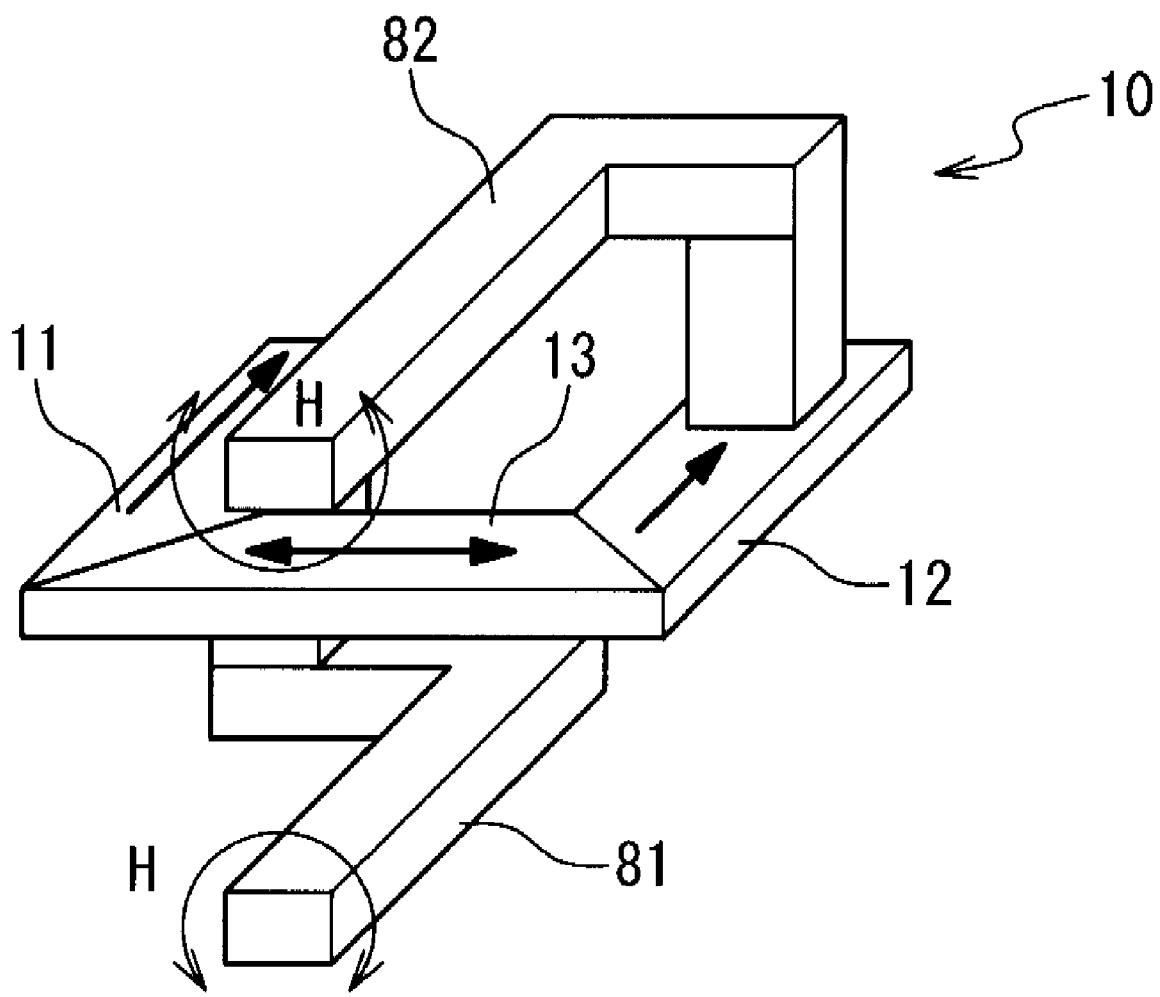
FIG. 35 is an overhead view showing another example of a magnetic memory cell according to the eighth exemplary embodiment.

Also, as shown in FIG. 35, assist wirings 81 and 82 may be provided below and above the magnetization switching region 13, respectively. In this case, the assist wiring 81 is connected to one of the first magnetization fixed region 11 and the second magnetization fixed region 12, while the assist wiring 82 is connected to the other. Consequently, the assist effect is increased, which makes it possible to further reduce the write currents IW1 and IW2.

Figure 36:
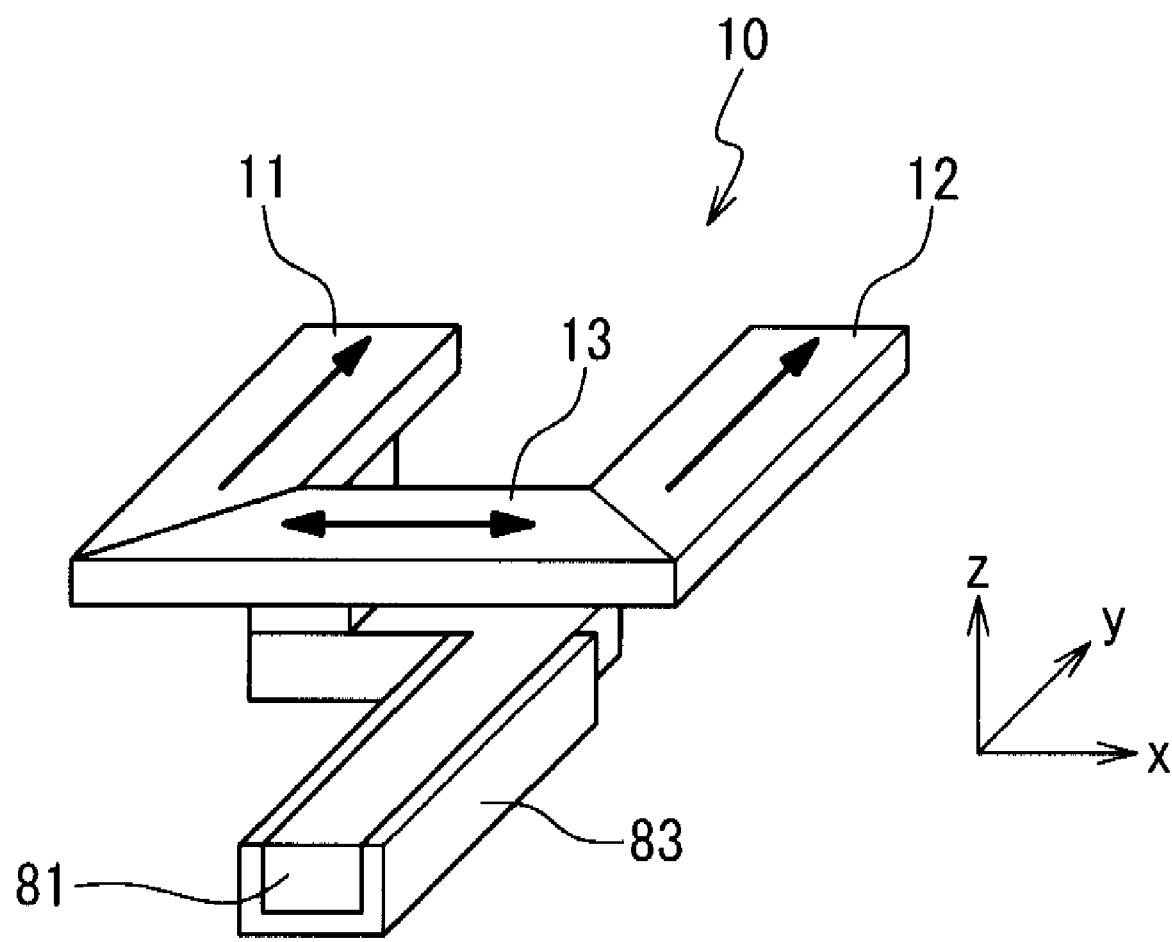
FIG. 36 is an overhead view showing still another example of a magnetic memory cell according to the eighth exemplary embodiment.

Furthermore, the assist wiring 81 (or 82) may have a yoke wiring structure as shown in FIG. 36. That is to say, surfaces of the assist wiring 81 (or 82) which do not face the magnetization switching region 13 may be partially covered by a magnetic layer 83. The magnetic layer 83 is made of Fe, Co, Ni or an alloy thereof. Although side surfaces and a bottom surface of the assist wiring 81 are covered by the magnetic layer 83 in FIG. 36, it is also possible that only the bottom surface is covered. The assist magnetic field is increased by such a yoke wiring structure, which makes it possible to further reduce the write currents IW1 and IW2.

Furthermore, according to the present exemplary embodiment, a write margin is enlarged because the write currents IW1 and IW2 are reduced. The reason is as follows. The write currents IW1 and IW2 need to be set within a range from a current Imin to a current Imax. The current Imin is a lower limit current which allows the domain wall to move within the magnetization switching region 13. The current Imax is a minimum current which causes the domain wall to move into the magnetization fixed regions 11 or 12. The reduction of the write currents IW1 and IW2 means reduction of the current Imin. Thus, the write margin is enlarged. It should be noted that in the case where the magnetic recording layer 10 is formed to have the U-shape as shown in FIGS. 33 to 36, the assist magnetic field does not affect a domain wall motion within the magnetization fixed regions 11 and 12 that should not occur under normal circumstances. Therefore, the U-shaped magnetic recording layer 10 is preferable from a viewpoint of the assist magnetic field.

Also, the assist wirings 81 and 82 may not be connected to the magnetic recording layer 10. In this case, currents flowing through the assist wirings 81 and 82 are controlled independently of the write currents IW1 and IW2. However, the configurations shown in the foregoing FIGS. 33 to 36 are desirable from a viewpoint of the number of wirings and a control circuit. That is to say, it is preferable that the wiring for supplying the write currents IW1 and IW2 to the magnetic recording layer 10 is utilized as the assist wiring 81 or 82. In this case, increase in the number of wirings is prevented and there is no need to provide a special control circuit.

9. Ninth Exemplary Embodiment

Figure 37:
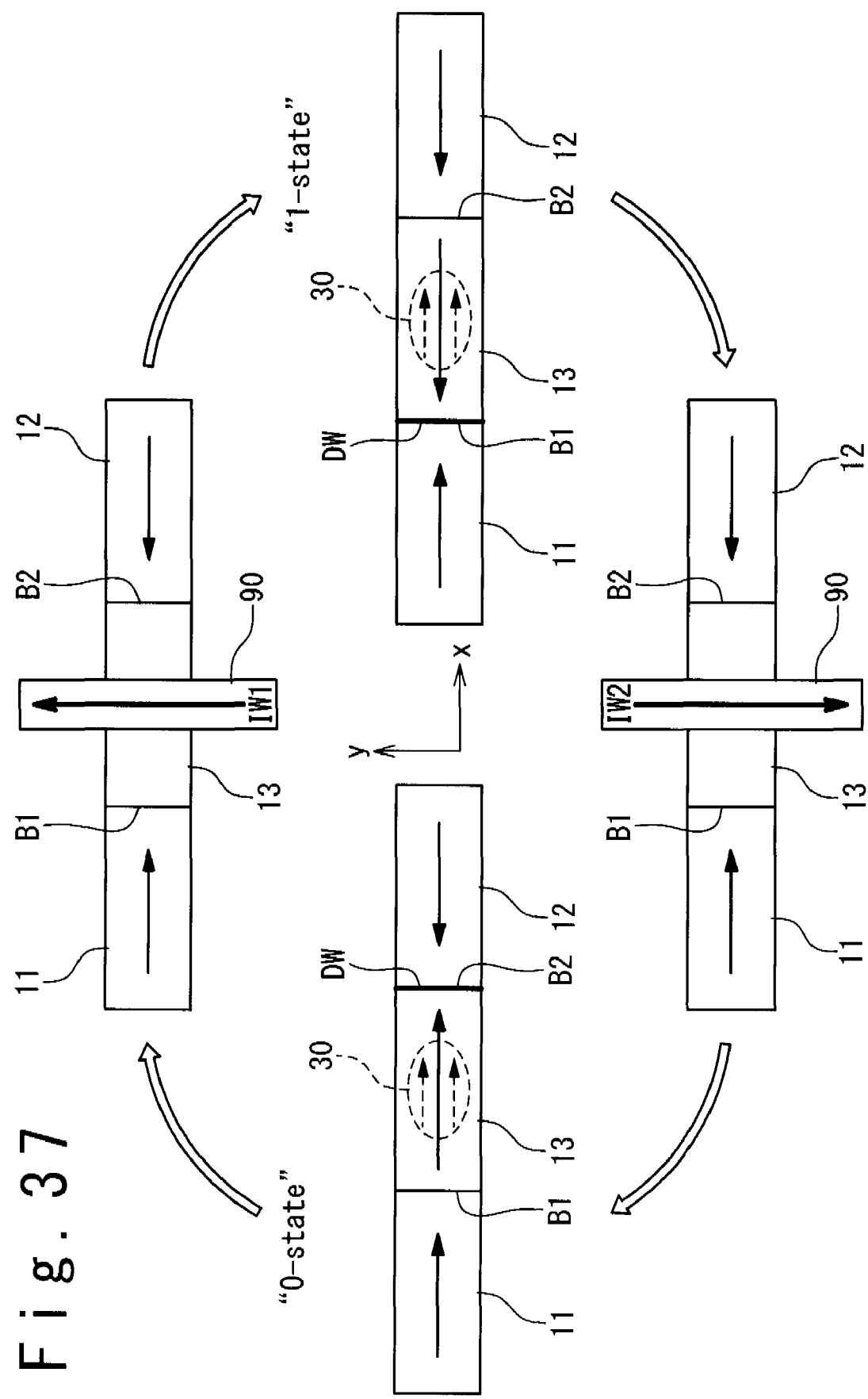
FIG. 37 is a plan view showing a structure of an MRAM according to a ninth exemplary embodiment of the present invention and a principle of data writing for the MRAM.

It is also possible to write a data to the magnetic memory cell 1 explained in the foregoing exemplary embodiments by applying a write magnetic field from the outside. In this case, the MRAM is provided with a write wiring 90 that is magnetically coupled with the magnetic recording layer 10 (magnetization switching region 13), as shown in FIG. 37. At the time of writing data "1", a first write current IW1 is flowed in the +Y direction through the write wiring 90. A first write magnetic field generated by the first write current IW1 is applied to the magnetization switching region 13. As a result, the magnetization of the magnetization switching region 13 is reversed, and the domain wall DW moves from the second boundary B2 to the first boundary B1. On the other hand, at the time of writing data "0", a second write current IW2 is flowed in the −Y direction through the write wiring 90. A second write magnetic field generated by the second write current IW2 is applied to the magnetization switching region 13. The direction of the second write magnetic field is opposite to the direction of the first write magnetic field. As a result, the magnetization of the magnetization switching region 13 is reversed, and the domain wall DW moves from the first boundary B1 to the second boundary B2.

The invention claimed is:
1. A magnetic memory cell comprising:
a magnetic recording layer that is a ferromagnetic layer; and
a pinned layer connected to said magnetic recording layer through a non-magnetic layer,
wherein said magnetic recording layer includes:
a magnetization switching region having reversible magnetization and facing said pinned layer;
a first magnetization fixed region connected to a first boundary of said magnetization switching region and whose magnetization direction is fixed to a first direction; and
a second magnetization fixed region connected to a second boundary of said magnetization switching region and whose magnetization direction is fixed to a second direction,
wherein said first magnetization fixed region and said second magnetization fixed region are formed parallel to each other,
wherein said first direction and said second direction are the same direction,
wherein magnetization direction of said magnetization switching region is toward any of said first boundary and said second boundary, and a domain wall is formed at any of said first boundary and said second boundary in said magnetic recording layer.

2. The magnetic memory cell according to claim 1,
wherein said magnetization switching region, said first magnetization fixed region and said second magnetization fixed region are so formed as to have a U-shape.

3. The magnetic memory cell according to claim 1,
wherein said magnetization switching region, said first magnetization fixed region and said second magnetization fixed region are formed in a same plane.

4. The magnetic memory cell according to claim 1,
wherein said magnetization switching region is formed parallel to a first plane, while said first magnetization fixed region and said second magnetization fixed region are formed perpendicular to said first plane.

5. The magnetic memory cell according to claim 4,
wherein said magnetization switching region is formed on a bottom surface of a trench section, while said first magnetization fixed region and said second magnetization fixed region are respectively formed on opposed side surfaces of said trench section.

6. The magnetic memory cell according to claim 1,
further comprising:
a first magnetic body configured to apply a bias magnetic field of said first direction to said first magnetization fixed region; and
a second magnetic body configured to apply a bias magnetic field of said second direction to said second magnetization fixed region.

7. The magnetic memory cell according to claim 6,
wherein said first magnetic body and said second magnetic body are so provided as to be in contact with said first magnetization fixed region and said second magnetization fixed region, respectively,
wherein magnetization direction of said first magnetic body is said first direction and magnetization direction of said second magnetic body is said second direction.

8. The magnetic memory cell according to claim 6,
wherein said first magnetic body and said second magnetic body are so provided as to be apart from said first magnetization fixed region and said second magnetization fixed region, respectively.

9. The magnetic memory cell according to claim 8,
wherein said first magnetic body and said second magnetic body are provided above or below said first magnetization fixed region and said second magnetization fixed region, respectively,
wherein magnetization direction of said first magnetic body is opposite to said first direction and magnetization direction of said second magnetic body is opposite to said second direction.

10. The magnetic memory cell according to claim 8,
wherein said first magnetic body and said second magnetic body are provided in a same plane as that of said magnetic recording layer.

11. The magnetic memory cell according to claim 10,
wherein said first magnetic body and said second magnetic body are so provided as to sandwich said magnetic recording layer from both sides,
wherein magnetization direction in an end section of said first magnetic body closest to said first magnetization fixed region is said first direction and magnetization direction in an end section of said second magnetic body closest to said second magnetization fixed region is said second direction.

12. The magnetic memory cell according to claim 1,
wherein said first magnetization fixed region and said second magnetization fixed region have magnetic anisotropy of a same direction,
wherein said magnetization switching region has magnetic anisotropy of a direction different from that of said first magnetization fixed region and said second magnetization fixed region.

13. The magnetic memory cell according to claim 12,
wherein an external magnetic field whose direction is the same as said first direction and said second direction is applied.

14. The magnetic memory cell according to claim 1,
wherein a longitudinal direction of said first magnetization fixed region and a longitudinal direction of said second magnetization fixed region are the same,
wherein a longitudinal direction of said magnetization switching region is different from the longitudinal direction of said first magnetization fixed region and said second magnetization fixed region.

15. The magnetic memory cell according to claim 1,
wherein in a first write operation, a first write current is flowed from said first magnetization fixed region through said magnetization switching region to said second magnetization fixed region,
wherein in a second write operation, a second write current is flowed from said second magnetization fixed region through said magnetization switching region to said first magnetization fixed region.

16. The magnetic memory cell according to claim 15,
wherein a domain wall is formed at said first boundary in said magnetic recording layer due to said first write operation,
wherein a domain wall is formed at said second boundary in said magnetic recording layer due to said second write operation.

17. The magnetic memory cell according to claim 15,
wherein said first direction is toward said first boundary and said second direction is toward said second boundary,
wherein magnetization of said magnetization switching region turns toward said first boundary due to said first write operation,
wherein magnetization of said magnetization switching region turns toward said second boundary due to said second write operation.

18. The magnetic memory cell according to claim 15,
wherein said first direction is away from said first boundary and said second direction is away from said second boundary,
wherein magnetization of said magnetization switching region turns toward said second boundary due to said first write operation,
wherein magnetization of said magnetization switching region turns toward said first boundary due to said second write operation.

19. The magnetic memory cell according to claim 15,
further comprising an assist wiring so formed as to intersect with said magnetization switching region,
wherein a direction of a magnetic field applied to said magnetization switching region due to a current flowing through said assist wiring in said first write operation is toward one of said first boundary and said second boundary,
wherein a direction of a magnetic field applied to said magnetization switching region due to a current flowing through said assist wiring in said second write operation is toward the other of said first boundary and said second boundary.

20. The magnetic memory cell according to claim 19,
wherein said assist wiring is connected to said first magnetization fixed region or said second magnetization fixed region,
wherein in said first write operation, said first write current flows through said assist wiring,
wherein in said second write operation, said second write current flows through said assist wiring.

21. The magnetic memory cell according to claim 19,
wherein said assist wiring includes:
a first assist wiring formed below said magnetization switching region; and
a second assist wiring formed above said magnetization switching region.

22. The magnetic memory cell according to claim 1,
wherein in a first write operation, a first write magnetic field is applied to said magnetization switching region,
wherein in a second write operation, a second write magnetic field whose direction is opposite to that of said first write magnetic field is applied to said magnetization switching region.

23. The magnetic memory cell according to claim 1,
wherein in a read operation, a read current is flowed between said pinned layer and any of said first magnetization fixed region and said second magnetization fixed region through said magnetization switching region and said non-magnetic layer.

24. The magnetic memory cell according to claim 1,
wherein said magnetic recording layer includes a plurality of ferromagnetic layers which are anti-ferromagnetically coupled,
wherein a ferromagnetic layer among said plurality of ferromagnetic layers adjacent to said pinned layer through said non-magnetic layer includes said magnetization switching region, said first magnetization fixed region and said second magnetization fixed region.

25. The magnetic memory cell according to claim 1,
wherein said magnetic recording layer further includes:
another magnetization switching region having reversible magnetization; and
a third magnetization fixed region whose magnetization direction is fixed to a third direction,
wherein said another magnetization switching region is connected to said second magnetization fixed region at a third boundary and is connected to said third magnetization fixed region at a fourth boundary,
wherein said first magnetization fixed region, said second magnetization fixed region and said third magnetization fixed region are formed parallel to each other,
wherein said first direction, said second direction and said third direction are the same direction.

26. The magnetic memory cell according to claim 25,
wherein said another magnetization switching region is connected to another pinned layer through another non-magnetic layer.

27. The magnetic memory cell according to claim 1,
wherein said magnetization switching region is made of soft magnetic material.

28. The magnetic memory cell according to claim 27,
wherein said soft magnetic material is microcrystalline in which grain diameter is not more than a film thickness, or amorphous.

29. The magnetic memory cell according to claim 1,
wherein said magnetization switching region includes at least one element selected from the group consisting of Co, Fe and Ni.

30. The magnetic memory cell according to claim 29,
wherein composition of said magnetization switching region is represented by XX-YY-ZZ,
wherein said XX includes at least one element selected from the group consisting of Co, Fe and Ni, said YY includes at least one element selected from the group consisting of Al, Si, Mg, Ta, Nb, Zr, Hf, W, Mo, Ti and V, and said ZZ includes at least one element selected from the group consisting of N, C, B and O.

31. The magnetic memory cell according to claim 29,
wherein composition of said magnetization switching region is represented by XX-YY,
wherein said XX includes at least one element selected from the group consisting of Co, Fe and Ni, and said YY includes at least one element selected from the group consisting of Al, Si, Mg, Ta, Nb, Zr, Hf, W, Mo, Ti and V.

32. The magnetic memory cell according to claim 29,
wherein composition of said magnetization switching region is represented by XX ZZ,
wherein said XX includes at least one element selected from the group consisting of Co, Fe and Ni, and said ZZ includes at least one element selected from the group consisting of N, C, B and O.

33. A magnetic memory cell comprising:
a magnetic recording layer that is a ferromagnetic layer; and
a pinned layer connected to said magnetic recording layer through a non-magnetic layer,
wherein said magnetic recording layer includes:
a magnetization switching region having reversible magnetization and facing said pinned layer;
a first magnetization fixed region connected to a first boundary of said magnetization switching region and whose magnetization direction is fixed to a first direction; and
a second magnetization fixed region connected to a second boundary of said magnetization switching region and whose magnetization direction is fixed to a second direction,
wherein said magnetization switching region, said first magnetization fixed region and said second magnetization fixed region are linearly formed in a same plane,
wherein said first direction is opposite to said second direction,
wherein magnetization direction of said magnetization switching region is toward any of said first boundary and said second boundary, and a domain wall is formed at any of said first boundary and said second boundary in said magnetic recording layer,
wherein a cross-sectional area of said magnetization switching region increases with distance from said first boundary and said second boundary.

34. The magnetic memory cell according to claim 33,
wherein in a plane parallel to said first boundary and said second boundary, cross-sectional areas of said first magnetization fixed region and said second magnetization fixed region are smaller than a cross-sectional area of said magnetization switching region.

35. The magnetic memory cell according to claim 33,
wherein said magnetic recording layer further includes:
another magnetization switching region having reversible magnetization; and
a third magnetization fixed region whose magnetization direction is fixed to a third direction, wherein said another magnetization switching region is connected to said second magnetization fixed region at a third boundary and is connected to said third magnetization fixed region at a fourth boundary, wherein said magnetization switching region, said another magnetization switching region, said first magnetization fixed region, said second magnetization fixed region and said third magnetization fixed region are linearly formed, wherein said first direction is opposite to said second direction, and said first direction and said third direction are the same.

36. A magnetic random access memory comprising:
a magnetic memory cell;
a word line connected to said magnetic memory cell; and
a bit line connected to said magnetic memory cell,
wherein said magnetic memory cell comprises:
a magnetic recording layer that is a ferromagnetic layer; and
a pinned layer connected to said magnetic recording layer through a non-magnetic layer,
wherein said magnetic recording layer includes:
a magnetization switching region having reversible magnetization and facing said pinned layer;
a first magnetization fixed region connected to a first boundary of said magnetization switching region and whose magnetization direction is fixed to a first direction; and
a second magnetization fixed region connected to a second boundary of said magnetization switching region and whose magnetization direction is fixed to a second direction,
wherein said first magnetization fixed region and said second magnetization fixed region are formed parallel to each other,
wherein said first direction and said second direction are the same direction,
wherein magnetization direction of said magnetization switching region is toward any of said first boundary and said second boundary, and a domain wall is formed at any of said first boundary and said second boundary in said magnetic recording layer.

37. A data read and write method for a magnetic random access memory having a magnetic memory cell,
said magnetic memory cell comprising:
a magnetic recording layer that is a ferromagnetic layer; and
a pinned layer connected to said magnetic recording layer through a non-magnetic layer,
wherein said magnetic recording layer includes:
a magnetization switching region facing said pinned layer, in which a domain wall moves;
a first magnetization fixed region connected to a first boundary of said magnetization switching region and whose magnetization direction is fixed to a first direction; and
a second magnetization fixed region connected to a second boundary of said magnetization switching region and whose magnetization direction is fixed to a second direction,
wherein said first magnetization fixed region and said second magnetization fixed region are formed parallel to each other,
wherein said first direction and said second direction are the same direction,
wherein magnetization direction of said magnetization switching region is toward any of said first boundary and said second boundary, and a domain wall is formed at any of said first boundary and said second boundary in said magnetic recording layer, said data read and write method comprising:
(A) moving said domain wall to said first boundary by supplying a first write current from said first magnetization fixed region to said second magnetization fixed region, when writing a first data; and
(B) moving said domain wall to said second boundary by supplying a second write current from said second magnetization fixed region to said first magnetization fixed region, when writing a second data.

38. The data read and write method according to claim 37, further comprising:
(C) flowing a read current between said pinned layer and any of said first magnetization fixed region and said second magnetization fixed region through said magnetization switching region and said non-magnetic layer, when reading said first data or said second data stored in said magnetic memory cell.

39. A magnetic memory cell comprising:
a magnetic recording layer that is a ferromagnetic layer;
a pinned layer connected to said magnetic recording layer through a non-magnetic layer; and
an assist wiring,
wherein said magnetic recording layer includes:
a magnetization switching region having reversible magnetization and facing said pinned layer;
a first magnetization fixed region connected to a first boundary of said magnetization switching region and whose magnetization direction is fixed to a first direction; and
a second magnetization fixed region connected to a second boundary of said magnetization switching region and whose magnetization direction is fixed to a second direction,
wherein said first magnetization fixed region and said second magnetization fixed region are formed parallel to each other,
wherein said assist wiring is so formed as to intersect with said magnetization switching region,
wherein in a first write operation, a direction of a magnetic field applied to said magnetization switching region due to a current flowing through said assist wiring is toward one of said first boundary and said second boundary,
wherein in a second write operation, a direction of a magnetic field applied to said magnetization switching region due to a current flowing through said assist wiring is toward the other of said first boundary and said second boundary.

40. The magnetic memory cell according to claim 39,
wherein said assist wiring is connected to said first magnetization fixed region or said second magnetization fixed region,
wherein in said first write operation, a first write current flows through said assist wiring,
wherein in said second write operation, a second write current whose direction is opposite to that of said first write current flows through said assist wiring.

41. The magnetic memory cell according to claim 39,
wherein said assist wiring includes:
a first assist wiring formed below said magnetization switching region; and
a second assist wiring formed above said magnetization switching region.

42. The magnetic memory cell according to claim 39, wherein in said first write operation, a first write magnetic field is applied to said magnetization switching region, wherein in said second write operation, a second write magnetic field whose direction is opposite to that of said first write magnetic field is applied to said magnetization switching region.

43. The magnetic memory cell according to claim 39, wherein said magnetic recording layer includes a plurality of ferromagnetic layers which are anti-ferromagnetically coupled, wherein a ferromagnetic layer among said plurality of ferromagnetic layers adjacent to said pinned layer through said non-magnetic layer includes said magnetization switching region, said first magnetization fixed region and said second magnetization fixed region.

* * * * *